United States Patent
Weigel et al.

(10) Patent No.: US 10,693,024 B2
(45) Date of Patent: *Jun. 23, 2020

(54) BARRIER ASSEMBLY

(71) Applicant: 3M INNOVATIVE PROPERTIES COMPANY, Saint Paul, MN (US)

(72) Inventors: Mark D. Weigel, Hugo, MN (US); Mark A. Roehrig, Stillwater, MN (US); Alan K. Nachtigal, Minneapolis, MN (US); Samuel Kidane, Saint Paul, MN (US); Andrew J. Henderson, Eagan, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 136 days.

This patent is subject to a terminal disclaimer.

(21) Appl. No.: 16/017,128

(22) Filed: Jun. 25, 2018

(65) Prior Publication Data

US 2018/0309005 A1    Oct. 25, 2018

Related U.S. Application Data

(63) Continuation of application No. 15/176,427, filed on Jun. 8, 2016, now abandoned, which is a continuation
(Continued)

(51) Int. Cl.
*H01L 31/048*    (2014.01)
*B32B 7/02*    (2019.01)
(Continued)

(52) U.S. Cl.
CPC ............ *H01L 31/0481* (2013.01); *B32B 7/02* (2013.01); *B32B 7/12* (2013.01);
(Continued)

(58) Field of Classification Search
None
See application file for complete search history.

(56) References Cited

U.S. PATENT DOCUMENTS

| | | | |
|---|---|---|---|
| 3,444,129 A | 5/1969 | Young | |
| 3,460,961 A | 8/1969 | Young | |

(Continued)

FOREIGN PATENT DOCUMENTS

| | | |
|---|---|---|
| EP | 2093804 | 8/2009 |
| EP | 2357081 | 8/2011 |

(Continued)

OTHER PUBLICATIONS

Affinito, "Polymer-Oxide Transparent Barrier Layers", Society of Vacuum Coaters 39th Annual Technical Conference—Paper No. W-12, 1996, pp. 1-6.
(Continued)

*Primary Examiner* — Prashant J Khatri
(74) *Attorney, Agent, or Firm* — Janet A. Kling

(57) ABSTRACT

An assembly that includes a barrier film interposed between a first polymeric film substrate and a first major surface of a pressure sensitive adhesive layer is provided. The first polymeric film substrate has a first coefficient of thermal expansion that is, in some embodiments, up to 50 parts per million per Kelvin. The pressure sensitive adhesive layer has a second major surface opposite the first major surface that is disposed on a second polymeric film substrate. The second polymeric film substrate is typically resistant to degradation by ultraviolet light. In some embodiments, the second polymeric film substrate has a second coefficient of thermal expansion that is at least 40 parts per million per Kelvin higher than the first coefficient of thermal expansion. The assembly is transmissive to visible and infrared light.

17 Claims, 1 Drawing Sheet

Related U.S. Application Data of application No. 13/175,495, filed on Jul. 1, 2011, now Pat. No. 9,997,657.

(60) Provisional application No. 61/361,133, filed on Jul. 2, 2010.

(51) Int. Cl.

| | | |
|---|---|---|
| B32B 7/12 | (2006.01) | |
| B32B 27/28 | (2006.01) | |
| B32B 27/30 | (2006.01) | |
| B32B 27/32 | (2006.01) | |
| B32B 27/34 | (2006.01) | |
| B32B 27/36 | (2006.01) | |
| B32B 17/10 | (2006.01) | |
| B32B 27/08 | (2006.01) | |

(52) U.S. Cl.
CPC ........ *B32B 17/10018* (2013.01); *B32B 27/08* (2013.01); *B32B 27/281* (2013.01); *B32B 27/283* (2013.01); *B32B 27/286* (2013.01); *B32B 27/302* (2013.01); *B32B 27/304* (2013.01); *B32B 27/308* (2013.01); *B32B 27/32* (2013.01); *B32B 27/322* (2013.01); *B32B 27/34* (2013.01); *B32B 27/36* (2013.01); *B32B 27/365* (2013.01); *B32B 2255/10* (2013.01); *B32B 2255/20* (2013.01); *B32B 2307/412* (2013.01); *B32B 2307/416* (2013.01); *B32B 2307/42* (2013.01); *B32B 2307/546* (2013.01); *B32B 2307/71* (2013.01); *B32B 2307/712* (2013.01); *B32B 2307/7246* (2013.01); *B32B 2307/732* (2013.01); *B32B 2327/12* (2013.01); *B32B 2367/00* (2013.01); *B32B 2457/12* (2013.01); *B32B 2551/00* (2013.01); *Y02E 10/50* (2013.01); *Y10T 428/2495* (2015.01); *Y10T 428/24942* (2015.01); *Y10T 428/31663* (2015.04); *Y10T 428/31667* (2015.04)

(56) References Cited

U.S. PATENT DOCUMENTS

| | | | |
|---|---|---|---|
| 3,492,261 A | | 1/1970 | Young |
| 3,503,779 A | | 3/1970 | Young |
| 3,775,226 A | | 11/1973 | Windorf |
| 4,329,384 A | | 5/1982 | Vesley |
| 4,330,590 A | | 5/1982 | Vesley |
| 4,379,201 A | | 4/1983 | Heilmann |
| 4,696,719 A | | 9/1987 | Bischoff |
| 4,722,515 A | | 2/1988 | Ham |
| 4,737,559 A | | 4/1988 | Kellen |
| 4,842,893 A | | 6/1989 | Yializis |
| 4,954,371 A | | 9/1990 | Yializis |
| 5,018,048 A | | 5/1991 | Shaw |
| 5,032,461 A | | 7/1991 | Shaw |
| 5,073,611 A | | 12/1991 | Rehmer |
| 5,097,800 A | | 3/1992 | Shaw |
| 5,125,138 A | | 6/1992 | Shaw |
| 5,248,739 A | | 9/1993 | Schmidt |
| 5,440,446 A | | 8/1995 | Shaw |
| 5,464,667 A | | 11/1995 | Kohler |
| 5,540,978 A | | 7/1996 | Schrenk |
| 5,547,908 A | | 8/1996 | Furuzawa |
| 5,725,909 A | | 3/1998 | Shaw |
| 5,770,301 A | | 6/1998 | Murai |
| 5,840,428 A | | 11/1998 | Blizzard |
| 6,045,864 A | | 4/2000 | Lyons |
| 6,191,199 B1 * | | 2/2001 | Renz ............... B32B 7/12 524/100 |
| 6,214,422 B1 | | 4/2001 | Yializis |
| 6,231,939 B1 | | 5/2001 | Shaw |
| 6,306,507 B1 | | 10/2001 | Brunelle |
| 6,348,237 B2 | | 2/2002 | Kohler |
| 6,369,316 B1 | | 4/2002 | Plessing |
| 6,413,645 B1 | | 7/2002 | Graff |
| 6,449,093 B2 | | 9/2002 | Hebrink |
| 6,465,726 B2 | | 10/2002 | Yamada |
| 6,514,584 B1 | | 2/2003 | Merlin |
| 6,686,008 B1 | | 2/2004 | Merlin |
| 6,744,561 B2 | | 6/2004 | Condo |
| 6,783,349 B2 | | 8/2004 | Neavin |
| 6,878,440 B1 | | 4/2005 | Yamanaka |
| 7,015,640 B2 | | 3/2006 | Schaepkens |
| 7,018,713 B2 | | 3/2006 | Padiyath |
| 7,074,501 B2 | | 7/2006 | Czeremuszkin |
| 7,077,935 B2 | | 7/2006 | Ziegler |
| 7,323,514 B2 | | 1/2008 | Jing |
| 8,115,326 B2 | | 2/2012 | Aitken |
| 8,628,589 B2 | | 1/2014 | Weigel |
| 2001/0009160 A1 | | 7/2001 | Otani |
| 2003/0029493 A1 | | 2/2003 | Plessing |
| 2004/0031977 A1 | | 2/2004 | Brown |
| 2004/0077892 A1 | | 4/2004 | Arkles |
| 2004/0091713 A1 | | 5/2004 | Suwa |
| 2004/0253428 A1 | | 12/2004 | Wang |
| 2005/0181212 A1 | | 8/2005 | Schaepkens |
| 2006/0084780 A1 | | 4/2006 | Hebrink |
| 2006/0142412 A1 | | 6/2006 | Yamaoka |
| 2007/0020451 A1 | | 1/2007 | Padiyath |
| 2007/0099004 A1 | | 5/2007 | Edelmann |
| 2007/0148473 A1 | | 6/2007 | Moore |
| 2007/0215195 A1 | | 9/2007 | Buller |
| 2007/0232822 A1 | | 10/2007 | Arkles |
| 2007/0287277 A1 | | 12/2007 | Kolics |
| 2008/0196664 A1 | | 8/2008 | David |
| 2009/0130463 A1 | | 5/2009 | Albaugh |
| 2010/0119840 A1 | | 5/2010 | Padiyath |
| 2010/0147443 A1 | | 6/2010 | Utesch |
| 2010/0289980 A1 | | 11/2010 | Husemann |
| 2011/0064947 A1 | | 5/2011 | Aiba |
| 2011/0287233 A1 | | 11/2011 | Ma |
| 2012/0003448 A1 | | 1/2012 | Weigel |
| 2012/0003484 A1 | | 1/2012 | Roehrig |
| 2012/0011850 A1 | | 1/2012 | Hebrink |
| 2012/0208033 A1 | | 8/2012 | Weigel |

FOREIGN PATENT DOCUMENTS

| | | |
|---|---|---|
| JP | 05131590 | 5/1993 |
| JP | 09132767 | 5/1997 |
| JP | 2002-188038 | 7/2002 |
| JP | 2005-169696 | 6/2005 |
| JP | 2007-152847 A | 6/2007 |
| JP | 2007-261020 | 10/2007 |
| JP | 2010-005817 | 1/2010 |
| WO | WO 2000-26973 | 5/2000 |
| WO | WO 2000-061664 | 10/2000 |
| WO | WO 2007-087281 | 8/2007 |
| WO | WO 2009-086095 | 7/2009 |
| WO | WO 2009-103734 | 8/2009 |
| WO | WO 2010-058988 | 5/2010 |
| WO | WO 2010-064491 | 6/2010 |
| WO | WO 2010-078105 | 7/2010 |
| WO | WO 2011-062836 | 5/2011 |
| WO | WO 2011-062932 | 5/2011 |
| WO | WO 2011-113008 | 9/2011 |

OTHER PUBLICATIONS

Affinito, "Vacuum deposited polymer/metal multilayer films for optical application", Thin Solid Films, vol. 270, 1995, pp. 43-48.

D'Agostino (Ed), "Plasma Deposition, Treatment & Etching of Polymers," Academic Press, New York (1990), 5 pages.

ASTM Designation: G 155-05a, "Standard Practice for Operating Xenon Arc Light Apparatus for Exposure of Non-Metallic Materials", 2005, pp. 1-11.

ASTM Designation: D 1876-08, "Standard Test Method for Peel Resistance of Adhesives (T-Peel Test)[1]", pp. 1-3.

(56) References Cited

OTHER PUBLICATIONS

ASTM Designation: F 1249-06, "Standard Test Method for Water Vapor Transmission Rate Through Plastic Film and Sheeting Using a Modulated Infrared Sensor", 2006, pp. 1-5.
Biederman, "Plasma Polymerization Processes," Plasma Technology, 3, Elsever, New York, 1992, 5 pages.
Roehrig "Use of Evaporated Acrylate Coatings to Smooth the Surface of Polyester and Polypropylene Film Substrates", RadTech, Journal of Plastic Film and Sheeting, vol. 13, 1997, pp. 235-251.
Satas, "Handbook of Pressure Sensitive Adhesive Technology", $2^{nd}$ Ed., 1989, 8 pages.
Shaw, "A New High Speed Process for Vapor Depositing Acrylate Thin Films: An Update", Society of Vacuum Coaters 36th Annual Technical Conference Proceedings, 1993, pp. 348-352.
Shaw, "A New Vapor Deposition Process for Coating Paper and Polymer Webs", 6th International Vacuum Web Coating Conference, Oct. 28, 1992, pp. 18-24.
Shaw, "Use of Vapor Deposited Acrylate Coatings to Improve the Barrier Properties of Metallized Film", Society of Vacuum Coaters 37th Annual Technical Conference Proceedings, 1994, pp. 240-247.
Swanson, "Measurement of Web Curl" 2006 AWEB conference proceedings (Association of Industrial Metallizers, Coaters and Laminators, Applied Web Handling Conference Proceedings, 2006), vol. 2 of 2, pp. 1044-1081.
International Search Report for PCT/US2011/042731, dated Sep. 29, 2011, 6 pages.
International Search Report for PCT/US2011/042732, dated Sep. 6, 2011, 3 pages.
Supplemental European Search Report for EP11801468 dated Aug. 30, 2016.
Supplemental European Search Report for EP11801469 dated Aug. 30, 2016.

* cited by examiner

BARRIER ASSEMBLY

BACKGROUND

Emerging solar technologies such as organic photovoltaic devices (OPVs) and thin film solar cells like copper indium gallium di-selenide (CIGS) require protection from water vapor and need to be durable (e.g., to ultra-violet (UV) light) in outdoor environments. Typically, glass has been used as an encapsulating material for such solar devices because glass is a very good barrier to water vapor, is optically transparent, and is stable to UV light. However, glass is heavy, brittle, difficult to make flexible, and difficult to handle. There is interest in developing transparent flexible encapsulating materials to replace glass that will not share the drawbacks of glass but have glass-like barrier properties and UV stability, and a number of flexible barrier films have been developed that approach the barrier properties of glass.

SUMMARY

Despite progress in encapsulant technology, the barrier and durability requirements in solar applications continue to be a challenge, and further work is needed to bring effective, flexible encapsulating solutions to the solar market. The present disclosure provides assemblies useful, for example, for encapsulating solar devices. The assemblies disclosed herein are generally flexible, transmissive to visible and infrared light, and have excellent barrier properties.

While fluoropolymer and other weatherable films have been said to be useful components of encapsulating systems for flexible photovoltaic cells (e.g., in U.S. Pat. App. Pub. No. 2003/0029493), fluoropolymer films may have coefficients of thermal expansion in excess of 100 parts per million per Kelvin (ppm/K), while flexible carriers (e.g., polyimide films or metal foils) useful for photovoltaic cells may have coefficients of thermal expansion of less than 30 ppm/K. Such a coefficient of thermal expansion mismatch between a fluoropolymer film and a flexible carrier can bring about thermal stresses in an encapsulated flexible photovoltaic cell. It has now been discovered that under certain thermal lamination conditions (e.g., 150° C.), encapsulating systems including multilayer barrier films on fluoropolymers laminated to low CTE flexible substrates with thermally curing encapsulants (e.g., ethylene-vinyl acetate) develop thermal stresses that can cause delamination.

Flexible photovoltaic cells (e.g., CIGS) have relatively high profiles (e.g., higher profiles than, for example, organic electroluminescence devices). Thin-film CIGS cells typically have bussing and tabbing ribbons that may, for example, stand more than 0.15 mm above the surface of the cell. These high profile components can act as stress concentrators that may exacerbate the problems caused by CTE mismatch.

The barrier assemblies according to the present disclosure are useful, for example, for minimizing the affects of CTE mismatch between a weatherable top layer and a flexible photovoltaic module that can result after a high temperature lamination.

In one aspect, the present disclosure provides an assembly that includes a barrier film interposed between a first polymeric film substrate and a first major surface of a pressure sensitive adhesive layer. The first polymeric film substrate has a first coefficient of thermal expansion. The pressure sensitive adhesive layer has a second major surface opposite the first major surface that is disposed on a second polymeric film substrate having a second coefficient of thermal expansion. The second coefficient of thermal expansion is at least 40 parts per million per Kelvin higher than the first coefficient of thermal expansion. The assembly is transmissive to visible and infrared light.

In another aspect, the present disclosure provides an assembly that includes a barrier film interposed between a first polymeric film substrate and a first major surface of a pressure sensitive adhesive layer. The first polymeric film substrate has a coefficient of thermal expansion up to 50 parts per million per Kelvin. The pressure sensitive adhesive layer has a second major surface opposite the first major surface that is disposed on a second polymeric film substrate that is resistant to degradation by ultraviolet light. The assembly is transmissive to visible and infrared light.

In this application, terms such as "a", "an" and "the" are not intended to refer to only a singular entity, but include the general class of which a specific example may be used for illustration. The terms "a", "an", and "the" are used interchangeably with the term "at least one". The phrases "at least one of" and "comprises at least one of" followed by a list refers to any one of the items in the list and any combination of two or more items in the list. All numerical ranges are inclusive of their endpoints and non-integral values between the endpoints unless otherwise stated.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figure 1:
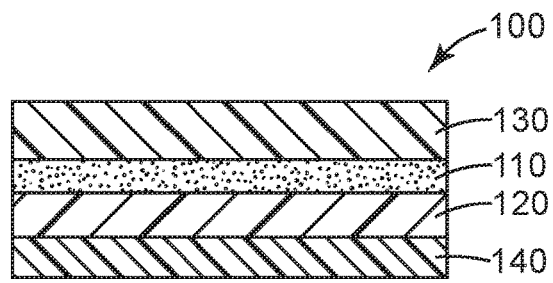
FIG. 1 illustrates an assembly according to some embodiments of the present disclosure using a schematic side view.

Barrier assemblies according to the present disclosure are transmissive to visible and infrared light. The term "transmissive to visible and infrared light" as used herein can mean having an average transmission over the visible and infrared portion of the spectrum of at least about 75% (in some embodiments at least about 80, 85, 90, 92, 95, 97, or 98%) measured along the normal axis. In some embodiments, the visible and infrared light-transmissive assembly has an average transmission over a range of 400 nm to 1400 nm of at least about 75% (in some embodiments at least about 80, 85, 90, 92, 95, 97, or 98%). Visible and infrared light-transmissive assemblies are those that do not interfere with absorption of visible and infrared light, for example, by photovoltaic cells. In some embodiments, the visible and infrared light-transmissive assembly has an average transmission over a range of wavelengths of light that are useful to a photovoltaic cell of at least about 75% (in some embodiments at least about 80, 85, 90, 92, 95, 97, or 98%). The first and second polymeric film substrates, pressure sensitive adhesive layer, and barrier film can be selected based on refractive index and thickness to enhance transmission to visible and infrared light.

Barrier assemblies according to the present disclosure are typically flexible. The term "flexible" as used herein refers to being capable of being formed into a roll. In some embodiments, the term "flexible" refers to being capable of being bent around a roll core with a radius of curvature of up to 7.6 centimeters (cm) (3 inches), in some embodiments up to 6.4 cm (2.5 inches), 5 cm (2 inches), 3.8 cm (1.5 inch), or 2.5 cm (1 inch). In some embodiments, the flexible assembly can be bent around a radius of curvature of at least 0.635 cm (¼ inch), 1.3 cm (½ inch) or 1.9 cm (¾ inch).

Barrier assemblies according to the present disclosure generally do not exhibit delamination or curl that can arise from thermal stresses or shrinkage in a multilayer structure. Herein, curl is measured using a curl gauge described in "Measurement of Web Curl" by Ronald P. Swanson presented in the 2006 AWEB conference proceedings (Association of Industrial Metallizers, Coaters and Laminators, Applied Web Handling Conference Proceedings, 2006). According to this method, curl can be measured to the resolution of 0.25 m$^{-1}$ curvature. In some embodiments, barrier assemblies according to the present disclosure exhibit curls of up to 7, 6, 5, 4, or 3 m$^{-1}$. From solid mechanics, the curvature of a beam is known to be proportional to the bending moment applied to it. The magnitude of bending stress in turn is known to be proportional to the bending moment. From these relations the curl of a sample can be used to compare the residual stress in relative terms. Barrier assemblies also typically exhibit high peel adhesion to EVA, and other common encapsulants for photovoltaics, cured on a substrate. The properties of the barrier assemblies disclosed herein typically are maintained even after high temperature and humidity aging.

Embodiments of assemblies according to the present disclosure are illustrated in FIGS. 1 to 4. FIG. 1 illustrates an assembly according to some embodiments of the present disclosure. Assembly 100 includes a barrier film 120, which can be described as having two major surfaces. On the lower major surface in the illustrated embodiment, the barrier film 120 is in contact with a first polymeric film substrate 140. On the upper major surface in the illustrated embodiment, the barrier film 120 is in contact with a pressure sensitive adhesive layer 110, which adheres the barrier film 120 to a major surface of the second polymeric film substrate 130.

Figure 2:
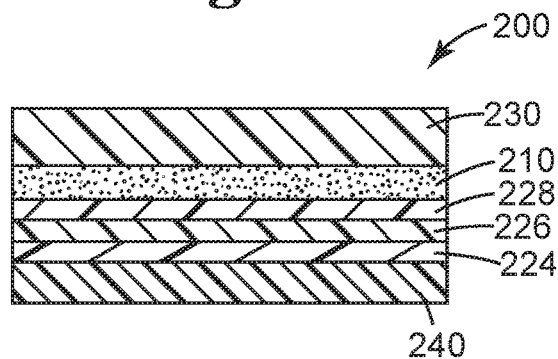
FIG. 2 illustrates a schematic side view of an embodiment of an assembly according to the present disclosure in which the barrier film has layers.

FIG. 2 illustrates another assembly 200 according to some embodiments of the present disclosure, in which the barrier film has layers 228, 226, and 224. In the illustrated embodiment, first and second polymer layers 224 and 228 are separated by a visible light-transmissive inorganic barrier layer 226, which is in intimate contact with the first and second polymer layers 224 and 228. In the illustrated embodiment, the first polymer layer 224 is in contact with the first polymeric film substrate 240, and the second polymer layer 228 is in contact with pressure sensitive adhesive layer 210, which adheres the second polymer layer 228 to a major surface of the second polymeric film substrate 230. The second polymer layer 228 and inorganic barrier layer 226 can be called a dyad. Although only one dyad is shown in FIG. 2 (and FIG. 4), assembly 200 can include additional dyads (e.g., 1, 2, 3, 5, 10, or more additional dyads) between pressure sensitive adhesive layer 210 and first polymer layer 224. Furthermore, in some embodiments, an additional inorganic barrier layer (not shown), or half dyad, may be between the second polymer layer 228 and the pressure sensitive adhesive layer 210.

Figure 3:
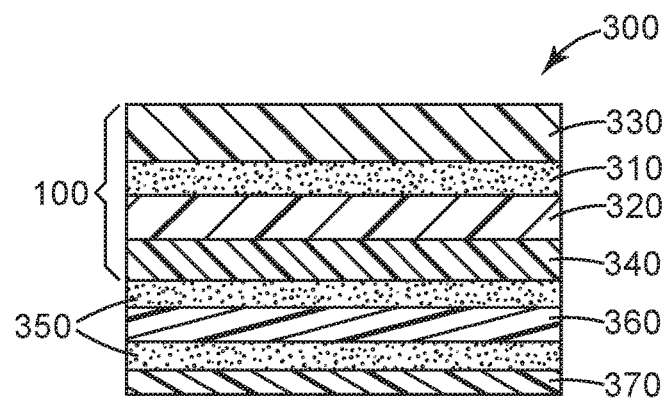
FIG. 3 illustrates a schematic side view of another embodiment of an assembly according to the present disclosure in which the assembly includes a photovoltaic module.
Figure 4:
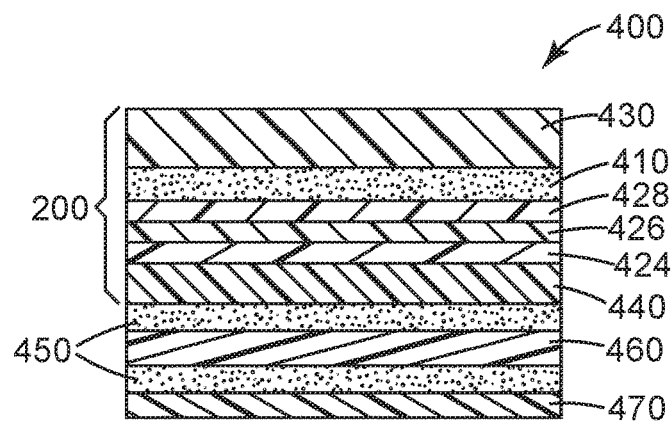
FIG. 4 illustrates a schematic side view of an embodiment of an assembly according to the present disclosure in which the barrier film has layers and in which the assembly includes a photovoltaic module.

In FIG. 3, assembly 300 is similar to assembly 100 illustrated in FIG. 1 and includes second polymeric film substrate 330 adhered to the upper surface of barrier film 320 with pressure sensitive adhesive layer 310 and first polymeric film substrate 340 in contact with the lower major surface of the barrier film 320. In FIG. 4, the barrier film in assembly 400 has layers 428, 426, and 424 and is similar to assembly 200 illustrated in FIG. 2. In the embodiments illustrated in FIGS. 3 and 4, assemblies 300 and 400 include a photovoltaic cell 360 and 460 (e.g., a CIGS cell). The upper surface of the photovoltaic cell 360 and 460 is in contact with an encapsulant 350 and 450 joining the photovoltaic cell 360 and 460 to the barrier assembly 100 and 200, respectively. The lower surface of the photovoltaic cell 360 and 460 is in contact with an encapsulant 350 and 450 joining the photovoltaic cell 360 and 460 to backing film 370 and 470, respectively.

First polymeric film substrates 140, 240, 340, and 440; second polymeric film substrates 130, 230, 330, and 430; barrier films 120 and 320; and pressure sensitive adhesive 110, 210, 310, and 410 useful for practicing the present disclosure are described in more detail below. In some embodiments of the assemblies disclosed herein, a pressure sensitive adhesive disclosed herein is disposed on a barrier assembly. In these embodiments, the barrier assembly is part of the assembly and comprises the polymeric film substrates and the barrier film described below. Accordingly, the description that follows refers to polymeric film substrates and barrier films that may be in an assembly according to the present disclosure, a barrier assembly useful for practicing the present disclosure, or both.

First Polymeric Film Substrate

Assemblies according to the present disclosure comprise a first polymeric film substrate 140, 240, 340, 440. In the context of polymeric films (e.g., first and second polymeric film substrates), the term "polymeric" will be understood to include organic homopolymers and copolymers, as well as polymers or copolymers that may be formed in a miscible blend, for example, by co-extrusion or by reaction, including transesterification. The terms "polymer" and "copolymer" include both random and block copolymers.

The first polymeric film substrate may be selected, for example, so that its CTE is about the same (e.g., within about 10 ppm/K) or lower than the CTE of the device (e.g., flexible photovoltaic device) to be encapsulated. In other words, the first polymeric substrate may be selected to minimize the CTE mismatch between the first polymeric substrate and the device to be encapsulated. In some embodiments, the first polymeric film substrate has a CTE that is within 20, 15, 10, or 5 ppm/K of the device to be encapsulated. In some embodiments, it may be desirable to select the first polymeric film substrate that has a low CTE. For example, in some embodiments, the first polymeric film substrate has a CTE of up to 50 (in some embodiments, up to 45, 40, 35, or 30) ppm/K. In some embodiments, the CTE of the first polymeric film substrate is in a range from 0.1 to 50, 0.1 to 45, 0.1 to 40, 0.1 to 35, or 0.1 to 30 ppm/K. When the first polymeric film substrate is selected, the difference between the CTE of the first polymeric film substrate and the second polymeric film substrate (described below) may be, in some embodiments, at least 40, 50, 60, 70, 80, 90, 100, or 110 ppm/K. The difference between the CTE of the first polymeric film substrate and the second polymeric film substrate may be, in some embodiments, up to 150, 140, or 130 ppm/K. For example, the range of the CTE mismatch between the first and second polymeric film substrates may be, for example, 40 to 150 ppm/K, 50 to 140 ppm/K, or 80 to 130 ppm/K. The CTE of substrates can be determined by thermal mechanical analysis. And the CTE of many substrates can be found in product data sheets or handbooks.

In some embodiments, the first polymeric film substrate has a modulus (tensile modulus) up to $5 \times 10^9$ Pa. The tensile modulus can be measured, for example, by a tensile testing instrument such as a testing system available from Instron, Norwood, Mass., under the trade designation "INSTRON 5900". In some embodiments, the tensile modulus of the first polymeric film substrate is up to $4.5 \times 10^9$ Pa, $4 \times 10^9$ Pa, $3.5 \times 10^9$ Pa, or $3 \times 10^9$ Pa. The first and second polymeric film substrates may be selected, for example, such that the first polymeric film substrate has a higher tensile modulus than the second polymeric film substrate. This selection may maximize dimensional stability, for example, when there is a CTE mismatch of at least 40 ppm/K between the first and second polymeric film substrates. In some embodiments, the ratio of the tensile modulus of the first polymeric film substrate to the tensile modulus of the second polymeric film substrate is at least 2 to 1 (in some embodiments, at least 3 to 1 or 4 to 1). Typically, the tensile modulus of PET is about $4 \times 10^9$ Pa, and the tensile modulus of ETFE is about $1 \times 10^9$ Pa.

The first polymeric film substrate is typically a support onto which a barrier film can be deposited (e.g., using the methods described hereinbelow). In some embodiments, the first polymeric film substrate is heat-stabilized (e.g., using heat setting, annealing under tension, or other techniques) to minimize shrinkage up to at least the heat stabilization temperature when the support is not constrained. Exemplary suitable materials for the first polymeric film substrate include polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), and polyimide, any of which may optionally be heat-stabilized. These materials are reported to have CTEs of in a range from <1 to about 42 ppm/K. Suitable first polymeric film substrates are commercially available from a variety of sources. Polyimides are available, for example, from E.I. Dupont de Nemours & Co., Wilmington, Del., under the trade designation "KAPTON" (e.g, "KAPTON E" or "KAPTON H"); from Kanegafugi Chemical Industry Company under the trade designation "APICAL AV"; from UBE Industries, Ltd., under the trade designation "UPILEX". Polyethersulfones are available, for example, from Sumitomo. Polyetherimides are available, for example, from General Electric Company, under the trade designation "ULTEM". Polyesters such as PET are available, for example, from DuPont Teijin Films, Hopewell, Va.

For any of the embodiments of the first polymeric film substrate described above, the major surface of the first polymeric film substrate onto which the barrier film disclosed herein is deposited or otherwise joined can be treated to improve adhesion to the barrier film. Useful surface treatments include electrical discharge in the presence of a suitable reactive or non-reactive atmosphere (e.g., plasma, glow discharge, corona discharge, dielectric barrier discharge or atmospheric pressure discharge); chemical pretreatment; or flame pretreatment. A separate adhesion promotion layer may also be formed between the major surface of the first polymeric film substrate and the barrier film. The adhesion promotion layer can be, for example, a separate polymeric layer or a metal-containing layer such as a layer of metal, metal oxide, metal nitride or metal oxynitride. The adhesion promotion layer may have a thickness of a few nanometers (nm) (e.g., 1 or 2 nm) to about 50 nm or more.

In some embodiments, one side (that is, one major surface) of the first polymeric film substrate can be treated to enhance adhesion to the barrier film, and the other side (that is, major surface) can be treated to enhance adhesion to a device to be covered or an encapsulant (e.g., EVA) that covers such a device. Some useful first polymeric film substrates that are surface treated (e.g., with solvent or other pretreatments) are commercially available, for example, from Du Pont Teijin Films. For some of these films, both sides are surface treated (e.g., with the same or different pretreatments), and for others, only one side is surface treated.

In some embodiments, the first polymeric film substrate has a thickness from about 0.05 mm to about 1 mm, in some embodiments, from about 0.1 mm to about 0.5 mm or from 0.1 mm to 0.25 mm. Thicknesses outside these ranges may also be useful, depending on the application. In some embodiments, the first polymeric film substrate has a thickness of at least 0.05, 0.06, 0.07, 0.08, 0.09, 0.1, 0.11, 0.12, or 0.13 mm. In embodiments wherein the CTE of the second polymeric film substrate is more than 40 ppm/K higher than the CTE of the first polymeric film substrate, the ratio of the thickness of the first polymeric film substrate to the second polymeric film substrate may be adjusted and the to minimize the affect of CTE mismatch. For example, the ratio of the thicknesses of the first polymeric film substrate to the second polymeric film substrate may be in a range from 5:2 to 10:2 (in some embodiments, in a range from 5:2 to 8:2 or 5:2 to 7:2). In some embodiments, the ratio of the thicknesses of the first polymeric film substrate to the second polymeric film substrate is at least 5:2, 6:2, 7:2, or 8:2. As shown in the Examples, below, reducing the thickness of the second polymeric film substrate (e.g., the ETFE layer in the examples), which has a higher CTE and lower stiffness than the first polymeric film substrate, relative to the first polymeric film substrate reduced the bending moment in the assembly. Similarly, reducing the thickness of the first polymeric film layer (e.g., the PET layer in the Examples) increased the stress in the assembly.

Second Polymeric Film Substrate

Assemblies according to the present disclosure comprise a second polymeric film substrate 130, 230, 330, 430. The second polymeric film substrate is generally flexible and transmissive to visible and infrared light and comprises organic film-forming polymers. Useful materials that can form second polymeric film substrates include polyesters, polycarbonates, polyethers, polyimides, polyolefins, fluoropolymers, and combinations thereof.

In embodiments wherein the assembly according to the present disclosure is used, for example, for encapsulating solar devices, it is typically desirable for the second polymeric film substrate to be resistant to degradation by ultraviolet (UV) light and weatherable. Photo-oxidative degradation caused by UV light (e.g., in a range from 280 to 400 nm) may result in color change and deterioration of optical and mechanical properties of polymeric films. The second polymeric film substrates described herein can provide, for example, a durable, weatherable topcoat for a photovoltaic device. The substrates are generally abrasion and impact resistant and can prevent degradation of, for example, photovoltaic devices when they are exposed to outdoor elements.

A variety of stabilizers may be added to the polymeric film substrate to improve its resistance to UV light. Examples of such stabilizers include at least one of ultra violet absorbers (UVA) (e.g., red shifted UV absorbers), hindered amine light stabilizers (HALS), or anti-oxidants. These additives are described in further detail below. In some embodiments, the phrase "resistant to degradation by ultraviolet light" means that the second polymeric film substrate includes at least one ultraviolet absorber or hindered amine light stabilizer. In some embodiments, the phrase "resistant to degradation by ultraviolet light" means that the second polymeric film substrate at least one of reflects or absorbs at least 50 percent of incident ultraviolet light over at least a 30 nanometer range in a wavelength range from at least 300 nanometers to 400 nanometers. In some of these embodiments, the second polymeric film substrate need not include UVA or HALS.

The UV resistance of the second polymeric film substrate can be evaluated, for example, using accelerated weathering studies. Accelerated weathering studies are generally performed on films using techniques similar to those described in ASTM G-155, "Standard practice for exposing nonmetallic materials in accelerated test devices that use laboratory light sources". The noted ASTM technique is considered a sound predictor of outdoor durability, that is, ranking materials performance correctly. One mechanism for detecting the change in physical characteristics is the use of the weathering cycle described in ASTM G155 and a D65 light source operated in the reflected mode. Under the noted test, and when the UV protective layer is applied to the article, the article should withstand an exposure of at least 18,700 kJ/m$^2$ at 340 nm before the b* value obtained using the CIE L*a*b* space increases by 5 or less, 4 or less, 3 or less, or 2 or less before the onset of significant cracking, peeling, delamination or haze.

In some embodiments, the second polymeric film substrate disclosed herein comprises a fluoropolymer. Fluoropolymers typically are resistant to UV degradation even in the absence of stabilizers such as UVA, HALS, and anti-oxidants. Useful fluoropolymers include ethylene-tetrafluoroethylene copolymers (ETFE), tetrafluoroethylene-hexafluoropropylene copolymers (FEP), tetrafluoroethylene-hexafluoropropylene-vinylidene fluoride copolymers (THV), polyvinylidene fluoride (PVDF), blends thereof, and blends of these and other fluoropolymers.

As described above, the CTE of fluoropolymer films is typically high relative to films made from hydrocarbon polymers. For example, the CTE of a fluoropolymer film may be at least 75, 80, 90, 100, 110, 120, or 130 ppm/K. For example, the CTE of ETFE may be in a range from 90 to 140 ppm/K.

The substrates comprising fluoropolymer can also include non-fluorinated materials. For example, a blend of polyvinylidene fluoride and polymethyl methacrylate can be used. Useful flexible, visible and infrared light-transmissive substrates also include multilayer film substrates. Multilayer film substrates may have different fluoropolymers in different layers or may include at least one layer of fluoropolymer and at least one layer of a non-fluorinated polymer. Multilayer films can comprise a few layers (e.g., at least 2 or 3 layers) or can comprise at least 100 layers (e.g., in a range from 100 to 2000 total layers or more). The different polymers in the different multilayer film substrates can be selected, for example, to reflect a significant portion (e.g., at least 30, 40, or 50%) of UV light in a wavelength range from 300 to 400 nm as described, for example, in U.S. Pat. No. 5,540,978 (Schrenk). Such blends and multilayer film substrates may be useful for providing UV resistant substrates that have lower CTEs than the fluoropolymers described above.

Useful second polymeric film substrates comprising a fluoropolymer can be commercially obtained, for example, from E.I. duPont De Nemours and Co., Wilmington, Del., under the trade designation "TEFZEL ETFE" and "TEDLAR", from Dyneon LLC, Oakdale, Minn., under the trade designations "DYNEON ETFE", "DYNEON THV", "DYNEON FEP", and "DYNEON PVDF", from St. Gobain Performance Plastics, Wayne, N.J., under the trade designation "NORTON ETFE", from Asahi Glass under the trade designation "CYTOPS", and from Denka Kagaku Kogyo KK, Tokyo, Japan under the trade designation "DENKA DX FILM".

Some useful second polymeric film substrates other than fluoropolymers are reported to be resistant to degradation by UV light in the absence of UVA, HALS, and anti-oxidants. For example, certain resorcinol isophthalate/terephthalate copolyarylates, for example, those described in U.S. Pat. Nos. 3,444,129; 3,460,961; 3,492,261; and 3,503,779 are reported to be weatherable. Certain weatherable multilayer articles containing layers comprising structural units derived from a 1,3-dihydroxybenzene organodicarboxylate are reported in Int. Pat. App. Pub. No. WO 2000/061664, and certain polymers containing resorcinol arylate polyester chain members are reported in U.S. Pat. No. 6,306,507. Block copolyestercarbonates comprising structural units derived from at least one 1,3-dihydroxybenzene and at least one aromatic dicarboxylic acid formed into a layer and layered with another polymer comprising carbonate structural units are reported in US 2004/0253428. Weatherable films containing polycarbonate may have relatively high CTEs in comparison to polyesters, for example. The CTE of a second polymeric film substrate containing a polycarbonate may be, for example, about 70 ppm/K.

In some embodiments, the second polymeric film substrate useful for practicing the present disclosure comprises a multilayer optical film. In some embodiments, the second polymeric film substrate comprises an ultraviolet-reflective multilayer optical film having first and second major surfaces and comprising an ultraviolet-reflective optical layer stack, where the ultraviolet-reflective optical layer stack comprises first optical layers and second optical layers, wherein at least a portion of the first optical layers and at least a portion of the second optical layers are in intimate contact and have different refractive indexes, and wherein the multilayer optical film further comprises a ultraviolet absorber in at least one of the first optical layer, the second optical layer, or a third layer disposed on at least one of the first or second major surfaces of the ultraviolet reflective multilayer optical film. In some embodiments, the multilayer optical film comprises at least a plurality of first and second optical layers collectively reflecting at least 50 (in some embodiments, at least 55, 60, 65, 70, 75, 80, 85, 90, 95, 96, 97, or even at least 98) percent of incident UV light over at least a 30 (in some embodiments, at least 35, 40, 45, 50, 55, 60, 65, 70, 75, 80, 85, 90, 95, or even at least 100) nanometer wavelength range in a wavelength range from at least 300 nanometers to 400 nanometers. In some embodiments, some of at least one of the first or second optical layers (in some embodiments at least 50 percent by number of the first and/or second layers, in some embodiments all of at least one of the first or second layers) comprises a UV absorber. In some embodiments, the multilayer optical film comprises a third optical layer having first and second generally opposed first and second major surfaces and absorbing at least 50 (in some embodiments, at least 55, 60, 65, 70, 75, 80, 85, 90, or even at least 95) percent of incident UV light over at least a 30 (in some embodiments, at least 35, 40, 45, 50, 55, 60, 65, 70, 75, 80, 85, 90, 95, or even at least 100) nanometer wavelength range in a wavelength range from at least 300 nanometers to 400 nanometers. In some embodiments, the major surface of the plurality of first and second optical layers is proximate (i.e., not more than 1 mm, in some embodiments, not more than 0.75 mm, 0.5 mm, 0.4, mm, 0.3 mm, 0.25 mm, 0.2 mm, 0.15 mm, 0.1 mm, or even not greater than 0.05 mm; in some embodiments, contacting) to the first major surface of the third optical layer. There may be or may not be another multilayer optical film proximate the second surface of the third optical layer. In any of the aforementioned embodiments, the multilayer optical film may comprise a fourth optical layer comprising polyethylene naphthalate. In some embodiments, a plurality of the fourth optical layers collectively absorb at least 50 (in some embodiments, at least 55, 60, 65, 70, 75, 80, 85, 90, or even at least 95) percent of incident light over at least 30, 35, 40, 45, 50, 75, 100, 150, 200, 250, 300, 350, 400, 450, 500, 600, 700, 800, 900, 1000, 1100, 1200, 1300, 1400, 1500, 1600, 1700, 1800, 1900, 2000, or even 2100) nanometer wavelength range in a wavelength range from 400 nanometers to 2500 nanometers.

For multilayer optical films described herein, the first and second layers (in some embodiments, alternating first and second optical layers) of the multilayer optical films typically have a difference in refractive index of at least 0.04 (in some embodiments, at least 0.05, 0.06, 0.07, 0.08, 0.09. 0.1, 0.125, 0.15, 0.175, 0.2, 0.225, 0.25, 0.275, or even at least 0.3). In some embodiments, the first optical layer is birefringent and comprises a birefringent polymer. The layer thickness profile (layer thickness values) of multilayer optical film described herein reflecting at least 50 percent of incident UV light over a specified wavelength range can be adjusted to be approximately a linear profile with the first (thinnest) optical layers adjusted to have about a ¼ wave optical thickness (index times physical thickness) for 300 nm light and progressing to the thickest layers which would be adjusted to be about ¼ wave thick optical thickness for 420 nm light. Light that is not reflected at the interface between adjacent optical layers typically passes through successive layers and is either reflected at a subsequent interface, passes through the UV-reflective optical layer stack altogether, or may be absorbed by an absorbing layer.

The normal reflectivity for a particular layer pair is primarily dependent on the optical thickness of the individual layers, where optical thickness is defined as the product of the actual thickness of the layer times its refractive index. The intensity of light reflected from the optical layer stack is a function of its number of layer pairs and the differences in refractive indices of optical layers in each layer pair. The ratio $n_1d_1/(n_1d_1+n_2d_2)$ (commonly termed the "f-ratio") correlates with reflectivity of a given layer pair at a specified wavelength. In the f-ratio, $n_1$ and $n_2$ are the respective refractive indexes at the specified wavelength of the first and second optical layers in a layer pair, and $d_1$ and $d_2$ are the respective thicknesses of the first and second optical layers in the layer pair. By proper selection of the refractive indexes, optical layer thicknesses, and f-ratio one can exercise some degree of control over the intensity of first order reflection.

The equation $\lambda/2=n_1d_1+n_2d_2$ can be used to tune the optical layers to reflect light of wavelength $\lambda$, at a normal angle of incidence. At other angles, the optical thickness of the layer pair depends on the distance traveled through the component optical layers (which is larger than the thickness of the layers) and the indices of refraction for at least two of the three optical axes of the optical layer. The optical layers can each be a quarter-wavelength thick or the optical thin layers can have different optical thicknesses, as long as the sum of the optical thicknesses is half of a wavelength (or a multiple thereof). An optical stack having more than two layer pairs can include optical layers with different optical thicknesses to provide reflectivity over a range of wavelengths. For example, an optical stack can include layer pairs that are individually tuned to achieve optimal reflection of normally incident light having particular wavelengths or may include a gradient of layer pair thicknesses to reflect light over a larger bandwidth. A typical approach is to use all or mostly quarter-wave film stacks. In this case, control of the spectrum requires control of the layer thickness profile in the film stack.

Desirable techniques for providing a multilayer optical film with a controlled spectrum include the use of an axial rod heater control of the layer thickness values of coextruded polymer layers as described, for example, in U.S. Pat. No. 6,783,349 (Neavin et al.), the disclosure of which is incorporated herein by reference; timely layer thickness profile feedback during production from a layer thickness measurement tool such as an atomic force microscope (AFM), a transmission electron microscope, or a scanning electron microscope; optical modeling to generate the desired layer thickness profile; and repeating axial rod adjustments based on the difference between the measured layer profile and the desired layer profile.

The basic process for layer thickness profile control involves adjustment of axial rod zone power settings based on the difference of the target layer thickness profile and the measured layer profile. The axial rod power increase needed to adjust the layer thickness values in a given feedblock zone may first be calibrated in terms of watts of heat input per nanometer of resulting thickness change of the layers generated in that heater zone. For example, fine control of the spectrum is possible using 24 axial rod zones for 275 layers. Once calibrated, the necessary power adjustments can be calculated once given a target profile and a measured profile. The procedure is repeated until the two profiles converge.

Exemplary materials for making the optical layers that reflect (e.g., the first and second optical layers) include polymers and polymer blends (e.g., polyesters, copolyesters, modified copolyesters, and polycarbonates). Polyesters can be made, for example, from ring-opening addition polymerization of a lactone or by condensation of a dicarboxylic acid (or derivative thereof such as a diacid halide or a diester) with a diol. The dicarboxylic acid or dicarboxylic acid derivative molecules may all be the same or there may be two or more different types of molecules. The same applies to the diol monomer molecules. Polycarbonates can be made, for example, from the reaction of diols with esters of carbonic acid.

Examples of suitable dicarboxylic acid molecules for use in forming polyesters include 2,6-naphthalene dicarboxylic acid and isomers thereof; terephthalic acid; isophthalic acid; phthalic acid; azelaic acid; adipic acid; sebacic acid; norbornenedicarboxylic acid; bicyclooctane dicarboxylic acid; 1,6-cyclohexanedicarboxylic acid and isomers thereof; t-butyl isophthalic acid, trimellitic acid, sodium sulfonated isophthalic acid; 4,4'-biphenyl dicarboxylic acid and isomers thereof. Acid halides and lower alkyl esters of these acids, such as methyl or ethyl esters, may also be used as functional equivalents. The term "lower alkyl" refers, in this context, to C1-C10 straight-chained or branched alkyl groups. Examples of suitable diols for use in forming polyesters include ethylene glycol; propylene glycol; 1,4-butanediol and isomers thereof; 1,6-hexanediol; neopentyl glycol; polyethylene glycol; diethylene glycol; tricyclodecanediol; 1,4-cyclohexanedimethanol and isomers thereof; norbornanediol; bicyclooctanediol; trimethylol propane;

pentaerythritol; 1,4-benzenedimethanol and isomers thereof; bisphenol A; 1,8-dihydroxy biphenyl and isomers thereof; and 1,3-bis (2-hydroxyethoxy)benzene.

Exemplary birefringence polymers useful for the reflective layer(s) include polyethylene terephthalate (PET). Its refractive index for polarized incident light of 550 nm wavelength increases when the plane of polarization is parallel to the stretch direction from about 1.57 to as high as about 1.69. Increasing molecular orientation increases the birefringence of PET. The molecular orientation may be increased by stretching the material to greater stretch ratios and holding other stretching conditions fixed. Copolymers of PET (CoPET), such as those described in U.S. Pat. No. 6,744,561 (Condo et al.) and U.S. Pat. No. 6,449,093 (Hebrink et al.), the disclosures of which are incorporated herein by reference, are particularly useful for their relatively low temperature (typically less than 250° C.) processing capability making them more coextrusion compatible with less thermally stable second polymers. Other semicrystalline polyesters suitable as birefringent polymers include polybutylene 2,6-terephthalate (PBT), polyethylene terephthalate (PET), and copolymers thereof such as those described in U.S. Pat. No. 6,449,093 B2 (Hebrink et al.) or U.S. Pat. Pub. No. 20060084780 (Hebrink et al.), the disclosures of which are incorporated herein by reference. Other useful birefringent polymers include syndiotactic polystyrene (sPS); polyethylene 2,6-naphthalates (PENs); copolyesters derived from naphthalenedicarboxylic acid, an additional dicarboxylic acid, and a diol (coPENs) (e.g., a polyester derived through co-condensation of 90 equivalents of dimethyl naphthalenedicarboxylate, 10 equivalents of dimethyl terephthalate, and 100 equivalents of ethylene glycol, and having an intrinsic viscosity (IV) of 0.48 dL/g, and an index of refraction is approximately 1.63); polyether imides; and polyester/non-polyester combinations; polybutylene 2,6-naphthalates (PBNs); modified polyolefin elastomers, e.g., as available as ADMER (e.g., ADMER SE810) thermoplastic elastomers from Mitsui Chemicals America, Inc. of Rye Brook, N.Y.; and thermoplastic polyurethanes (TPUs) (e.g., as available as ELASTOLLAN TPUs from BASF Corp. of Florham Park, N.J. and as TECOFLEX or STATRITE TPUs (e.g., STATRITE X5091 or STATRITE M809) from The Lubrizol Corp. of Wickliffe, Ohio).

Further, for example, the second polymer (layer) of the multilayer optical film can be made from a variety of polymers having glass transition temperatures compatible with that of the first layer and having a refractive index similar to the isotropic refractive index of the birefringent polymer. Examples of other polymers suitable for use in optical films and, particularly, in the second polymer include vinyl polymers and copolymers made from monomers such as vinyl naphthalenes, styrene, maleic anhydride, acrylates, and methacrylates. Examples of such polymers include polyacrylates, polymethacrylates, such as poly (methyl methacrylate) (PMMA), and isotactic or syndiotactic polystyrene. Other polymers include condensation polymers such as polysulfones, polyamides, polyurethanes, polyamic acids, and polyimides. In addition, the second polymer can be formed from homopolymers and copolymers of polyesters, polycarbonates, fluoropolymers, and polydimethylsiloxanes, and blends thereof.

Many exemplary polymers for the optical layers, especially for use in the second layer, are commercially available and include homopolymers of polymethylmethacrylate (PMMA), such as those available from Ineos Acrylics, Inc., Wilmington, Del., under the trade designations "CP71" and "CP80;" and polyethyl methacrylate (PEMA), which has a lower glass transition temperature than PMMA. Additional useful polymers include copolymers of PMMA (CoPMMA), such as a CoPMMA made from 75 wt % methylmethacrylate (MMA) monomers and 25 wt % ethyl acrylate (EA) monomers, (available from Ineos Acrylics, Inc., under the trade designation "PERSPEX CP63" or Arkema, Philadelphia, Pa., under the trade designation "ATOGLAS 510"), a CoPMMA formed with MMA comonomer units and n-butyl methacrylate (nBMA) comonomer units, or a blend of PMMA and poly(vinylidene fluoride) (PVDF). Additional suitable polymers for the optical layers, especially for use in the second layer, include polyolefin copolymers such as poly (ethylene-co-octene) (PE-PO) available from Dow Elastomers, Midland, Mich., under the trade designation "ENGAGE 8200," poly (propylene-co-ethylene) (PPPE) available from Atofina Petrochemicals, Inc., Houston, Tex., under the trade designation "Z9470," and a copolymer of atactic polypropylene (aPP) and isotatctic polypropylene (iPP). The multilayer optical films can also include, for example, in the second layers, a functionalized polyolefin, such as linear low density polyethylene-g-maleic anhydride (LLDPE-g-MA) such as that available from E.I. duPont de Nemours & Co., Inc., under the trade designation "BYNEL 4105."

The third optical layer, if present, comprises a polymer and a UV-absorber and can serve as a UV protective layer. Typically, the polymer is a thermoplastic polymer. Examples of suitable polymers include polyesters (e.g., polyethylene terephthalate), fluoropolymers, acrylics (e.g., polymethyl methacrylate), silicone polymers (e.g., thermoplastic silicone polymers), styrenic polymers, polyolefins, olefinic copolymers (e.g., copolymers of ethylene and norbornene available as "TOPAS COC" from Topas Advanced Polymers of Florence, Ky.), silicone copolymers, and combinations thereof (e.g., a blend of polymethyl methacrylate and polyvinylidene fluoride).

Exemplary polymer compositions for the third layer and/or second layers in alternating layers with the at least one birefringent polymer include PMMA, CoPMMA, polydimethyl siloxane oxamide based segmented copolymer (SPDX), fluoropolymers including homopolymers such as PVDF and copolymers such as those derived from tetrafluoroethylene, hexafluoropropylene, and vinylidene fluoride (THV), blends of PVDF/PMMA, acrylate copolymers, styrene, styrene copolymers, silicone copolymers, polycarbonate, polycarbonate copolymers, polycarbonate blends, blends of polycarbonate and styrene maleic anhydride, and cyclic-olefin copolymers.

The selection of the polymer combinations used in creating the multilayer optical film depends, for example, upon the desired bandwidth that will be reflected. Higher refractive index differences between the birefringent polymer and the second polymer create more optical power thus enabling more reflective bandwidth. Alternatively, additional layers may be employed to provide more optical power. Preferred combinations of birefringent layers and second polymer layers may include, for example, the following: PET/THV, PET/SPDX, PEN/THV, PEN/SPDX, PEN/PMMA, PET/CoPMMA, PEN/CoPMMA, CoPEN/PMMA, CoPEN/SPDX, sPS/SPDX, sPS/THV, CoPEN/THV, PET/fluoroelastomers, sPS/fluoroelastomers and CoPEN/fluoroelastomers. The CTE of the multilayer optical film is typically a weighted average of the first polymer layers, second polymer layers, and any other polymer layers. In some embodiments, when a multilayer optical film is selected as the second polymeric film substrate, the CTE mismatch between the first and second polymeric film substrates is less than 40 ppm/K.

In some embodiments, material combinations for making the optical layers that reflect UV light (e.g., the first and second optical layers) include PMMA and THV and PET and CoPMMA. Exemplary material for making the optical layers that absorb UV light (e.g., the third optical layer) include PET, CoPMMA, or blends of PMMA and PVDF.

A UV absorbing layer (e.g., a UV protective layer) aids in protecting the visible/IR-reflective optical layer stack from UV-light caused damage/degradation over time by absorbing UV-light (preferably any UV-light) that may pass through the UV-reflective optical layer stack. In general, the UV-absorbing layer(s) may include any polymeric composition (i.e., polymer plus additives) that is capable of withstanding UV-light for an extended period of time. A variety of optional additives may be incorporated into an optical layer to make it UV absorbing. Examples of such additives include at least one of UV absorbers (UVAs), HALS, or anti-oxidants. Typical UV absorbing layers have thicknesses in a range from 13 micrometers to 380 micrometers (0.5 mil to 15 mil) with a UVA loading level of 2-10% by weight.

A UVA is typically a compound capable of absorbing or blocking electromagnetic radiation at wavelengths less than 400 nm while remaining substantially transparent at wavelengths greater than 400 nm. Such compounds can intervene in the physical and chemical processes of photoinduced degradation. UVAs are typically included in a UV absorbing layer in an amount sufficient to absorb at least 70% (in some embodiments, at least 80%, or greater than 90% of the UV light in the wavelength region from 180 nm to 400 nm). Typically, it is desirable if the UVA is highly soluble in polymers, highly absorptive, photo-permanent and thermally stable in the temperature range from 200° C. to 300° C. for extrusion processes to form the protective layer. The UVA can also be highly suitable if they can be copolymerizable with monomers to form protective coating layer by UV curing, gamma ray curing, e-beam curing, or thermal curing processes.

Red-shifted UVAs (RUVAs) typically have enhanced spectral coverage in the long-wave UV region, enabling it to block the high wavelength UV light that can cause yellowing in polyesters. One of the most effective RUVAs is a benzotriazole compound, 5-trifluoromethyl-2-(2-hydroxy-3-alpha-cumyl-5-tert-octylphenyl)-2H-benzotriazole (sold under the trade designation "CGL-0139" from Ciba Specialty Chemicals Corporation, Tarryton, N.Y.). Other exemplary benzotriazoles include 2-(2-hydroxy-3,5-di-alpha-cumylphehyl)-2H-benzotriazole, 5-chloro-2-(2-hydroxy-3-tert-butyl-5-methylphenyl)-2H-benzotiazole, 5-chloro-2-(2-hydroxy-3,5-di-tert-butylphenyl)-2H-benzotriazole, 2-(2-hydroxy-3,5-di-tert-amylphenyl)-2H-benzotriazole, 2-(2-hydroxy-3-alpha-cumyl-5-tert-octylphenyl)-2H-benzotriazole, 2-(3-tert-butyl-2-hydroxy-5-methylphenyl)-5-chloro-2Hbenzotriazole. Further exemplary RUVA includes 2(-4,6-diphenyl-1-3,5-triazin-2-yl)-5-hekyloxy-phenol. Other exemplary UV absorbers include those available from Ciba Specialty Chemicals Corporation under the trade designation "TINUVIN 1577," "TINUVIN 900," and "TINUVIN 777." Another exemplary UV absorber is available in a polyester master batch from Sukano Polymers Corporation, Dunkin S.C., under the trade designation "TA07-07 MB". Another exemplary UV absorber is available in a polycarbonate master batch from Sukano Polymers Corporation under the trade designation "TA28-09 MB". In addition, the UV absorbers can be used in combination with hindered amine light stabilizers (HALS) and anti-oxidants.

Exemplary HALS include those available from Ciba Specialty Chemicals Corporation, under the trade designation "CHIMASSORB 944" and "TINUVIN 123." Exemplary anti-oxidants include those obtained under the trade designations "IRGAFOS 126", "IRGANOX 1010" and "ULTRANOX 626", also available from Ciba Specialty Chemicals Corporation.

The desired thickness of a UV protective layer is typically dependent upon an optical density target at specific wavelengths as calculated by Beers Law. In some embodiments, the UV protective layer has an optical density greater than 3.5, 3.8, or 4 at 380 nm; greater than 1.7 at 390 nm; and greater than 0.5 at 400 nm. Those of ordinary skill in the art recognize that the optical densities typically should remain fairly constant over the extended life of the film in order to provide the intended protective function.

The UV protective layer and any optional additives may be selected to achieve the desired protective functions such as UV protection. Those of ordinary skill in the art recognize that there are multiple means for achieving the noted objectives of the UV protective layer. For example, additives that are very soluble in certain polymers may be added to the composition. Of particular importance, is the permanence of the additives in the polymer. The additives should not degrade or migrate out of the polymer. Additionally, the thickness of the layer may be varied to achieve desired protective results. For example, thicker UV protective layers would enable the same UV absorbance level with lower concentrations of UV absorbers, and would provide more UV absorber permanence attributed to less driving force for UV absorber migration.

For additional details on multilayer optical films that may be useful as second polymeric film substrates (e.g., UV mirrors), see, for example, International Patent Application Publication Nos. WO 2010/078105 (Hebrink et al.) and WO 2011/062836 (Hebrink et al.), the disclosures of which are incorporated herein by reference.

For any of the embodiments of the second polymeric film substrate described above, the major surface of the second polymeric film substrate (e.g., fluoropolymer) can be treated to improve adhesion to the PSA. Useful surface treatments include electrical discharge in the presence of a suitable reactive or non-reactive atmosphere (e.g., plasma, glow discharge, corona discharge, dielectric barrier discharge or atmospheric pressure discharge); chemical pretreatment (e.g., using alkali solution and/or liquid ammonia); flame pretreatment; or electron beam treatment. A separate adhesion promotion layer may also be formed between the major surface of the second polymeric film substrate and the PSA. In some embodiments, the second polymeric film substrate may be a fluoropolymer that has been coated with a PSA and subsequently irradiated with an electron beam to form a chemical bond between the substrate and the pressure sensitive adhesive; (see, e.g., U.S. Pat. No. 6,878,400 (Yamanaka et al.). Some useful second polymeric film substrates that are surface treated are commercially available, for example, from St. Gobain Performance Plastics under the trade designation "NORTON ETFE".

In some embodiments, the second polymeric film substrate has a thickness from about 0.01 mm to about 1 mm, in some embodiments, from about 0.05 mm to about 0.25 mm or from 0.05 mm to 0.15 mm. Thicknesses outside these ranges may also be useful, depending on the application. In embodiments wherein the CTE of the second polymeric film substrate is more than 40 ppm/K higher than the CTE of the first polymeric film substrate, the thickness of the second polymeric film substrate may be minimized to minimize the effect of the higher CTE. For example, the thickness of the second polymeric film substrate may be up to 0.2, 0.18, 0.16, 0.14, 0.13, or 0.12 mm.

While the second polymeric film substrate useful for practicing the present disclosure has excellent outdoor stability, barrier films are required in the assemblies disclosed herein to reduce the permeation of water vapor to levels that allow its use in long term outdoor applications such as building integrated photovoltaic's (BIPV).

Barrier Film

Barrier films 120, 320 useful for practicing the present disclosure can be selected from a variety of constructions. The term "barrier film" refers to films that provide a barrier to at least one of oxygen or water. Barrier films are typically selected such that they have oxygen and water transmission rates at a specified level as required by the application. In some embodiments, the barrier film has a water vapor transmission rate (WVTR) less than about 0.005 g/m$^2$/day at 38° C. and 100% relative humidity; in some embodiments, less than about 0.0005 g/m$^2$/day at 38° C. and 100% relative humidity; and in some embodiments, less than about 0.00005 g/m$^2$/day at 38° C. and 100% relative humidity. In some embodiments, the flexible barrier film has a WVTR of less than about 0.05, 0.005, 0.0005, or 0.00005 g/m$^2$/day at 50° C. and 100% relative humidity or even less than about 0.005, 0.0005, 0.00005 g/m$^2$/day at 85° C. and 100% relative humidity. In some embodiments, the barrier film has an oxygen transmission rate of less than about 0.005 g/m$^2$/day at 23° C. and 90% relative humidity; in some embodiments, less than about 0.0005 g/m$^2$/day at 23° C. and 90% relative humidity; and in some embodiments, less than about 0.00005 g/m$^2$/day at 23° C. and 90% relative humidity.

Exemplary useful barrier films include inorganic films prepared by atomic layer deposition, thermal evaporation, sputtering, and chemical vapor deposition. Useful barrier films are typically flexible and transparent.

In some embodiments, useful barrier films comprise inorganic/organic multilayers (e.g., 228, 226, 224 and 428, 426, 424). Flexible ultra-barrier films comprising inorganic/organic multilayers are described, for example, in U.S. Pat. No. 7,018,713 (Padiyath et al.). Such flexible ultra-barrier films may have a first polymer layer 224 disposed on polymeric film substrate 240 that is overcoated with two or more inorganic barrier layers 226 separated by at least one second polymer layer 228. In some embodiments, the barrier film comprises one inorganic barrier layer 226 interposed between the first polymer layer 224 disposed on the polymeric film substrate 240 and a second polymer layer 228.

The first and second polymer layers 224 and 228 can independently be formed by applying a layer of a monomer or oligomer and crosslinking the layer to form the polymer in situ, for example, by flash evaporation and vapor deposition of a radiation-crosslinkable monomer followed by crosslinking, for example, using an electron beam apparatus, UV light source, electrical discharge apparatus or other suitable device. The first polymer layer 224 is applied, for example, to the first polymeric film substrate 240, and the second polymer layer is typically applied to the inorganic barrier layer. The materials and methods useful for forming the first and second polymer layers may be independently selected to be the same or different. Useful techniques for flash evaporation and vapor deposition followed by crosslinking in situ can be found, for example, in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in published PCT Application No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996). In some embodiments, the polymer layers and inorganic barrier layer are sequentially deposited in a single pass vacuum coating operation with no interruption to the coating process.

The coating efficiency of the first polymer layer 224 can be improved, for example, by cooling the polymeric film substrate 240. Similar techniques can also be used to improve the coating efficiency of the second polymer layer 228. The monomer or oligomer useful for forming the first and/or second polymer layers can also be applied using conventional coating methods such as roll coating (e.g., gravure roll coating) or spray coating (e.g., example, electrostatic spray coating). The first and/second polymer layers can also be formed by applying a layer containing an oligomer or polymer in solvent and then removing the solvent using conventional techniques (e.g., at least one of heat or vacuum). Plasma polymerization may also be employed.

Volatilizable acrylate and methacrylate monomers are useful for forming the first and second polymer layers. In some embodiments, volatilizable acrylates are used. Volatilizable acrylate and methacrylate monomers may have a molecular weight in the range from about 150 to about 600 grams per mole, or, in some embodiments, from about 200 to about 400 grams per mole. In some embodiments, volatilizable acrylate and methacrylate monomers have a value of the ratio of the molecular weight to the number of (meth)acrylate functional groups per molecule in the range from about 150 to about 600 g/mole/(meth)acrylate group, in some embodiments, from about 200 to about 400 g/mole/(meth)acrylate group. Fluorinated acrylates and methacrylates can be used at higher molecular weight ranges or ratios, for example, about 400 to about 3000 molecular weight or about 400 to about 3000 g/mole/(meth)acrylate group. Exemplary useful volatilizable acrylates and methacrylates include hexanediol diacrylate, ethoxyethyl acrylate, phenoxyethyl acrylate, cyanoethyl (mono)acrylate, isobornyl acrylate, isobornyl methacrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris(2-hydroxyethyl)isocyanurate triacrylate, pentaerythritol triacrylate, phenylthioethyl acrylate, naphthloxyethyl acrylate, cyclic diacrylates (for example, EB-130 from Cytec Industries Inc. and tricyclodecane dimethanol diacrylate, available as SR833S from Sartomer Co.), epoxy acrylate RDX80095 from Cytec Industries Inc., and mixtures thereof.

Useful monomers for forming the first and second polymer layers are available from a variety of commercial sources and include urethane acrylates (e.g., available from Sartomer Co., Exton, Pa. under the trade designations "CN-968" and "CN-983"), isobornyl acrylate (e.g., available from Sartomer Co. under the trade designation "SR-506"), dipentaerythritol pentaacrylates (e.g., available from Sartomer Co. under the trade designation "SR-399"), epoxy acrylates blended with styrene (e.g., available from Sartomer Co. under the trade designation "CN-120S80"), di-trimethylolpropane tetraacrylates (e.g., available from Sartomer Co. under the trade designation "SR-355"), diethylene glycol diacrylates (e.g., available from Sartomer Co. under the trade designation "SR-230"), 1,3-butylene glycol diacrylate (e.g., available from Sartomer Co. under the trade designation "SR-212"), pentaacrylate esters (e.g., available from Sartomer Co. under the trade designation "SR-9041"), pentaerythritol tetraacrylates (e.g., available from Sartomer Co. under the trade designation "SR-295"), pentaerythritol triacrylates (e.g., available from Sartomer Co. under the trade designation "SR-444"), ethoxylated (3) trimethylolpropane triacrylates (e.g., available from Sartomer Co. under the trade designation "SR-454"), ethoxylated (3) trimethylolpropane triacrylates (e.g., available from Sartomer Co. under the trade designation "SR-454HP"), alkoxylated trifunctional acrylate esters (e.g., available from Sartomer Co. under the trade designation "SR-9008"), dipropylene glycol diacrylates (e.g., available from Sartomer Co. under the trade designation "SR-508"), neopentyl glycol diacrylates (e.g., available from Sartomer Co. under the trade designation "SR-247"), ethoxylated (4) bisphenol a dimethacrylates (e.g., available from Sartomer Co. under the trade designation "CD-450"), cyclohexane dimethanol diacrylate esters (e.g., available from Sartomer Co. under the trade designation "CD-406"), isobornyl methacrylate (e.g., available from Sartomer Co. under the trade designation "SR-423"), cyclic diacrylates (e.g., available from UCB Chemical, Smyrna, Ga., under the trade designation "IRR-214") and tris (2-hydroxy ethyl) isocyanurate triacrylate (e.g., available from Sartomer Co. under the trade designation "SR-368"), acrylates of the foregoing methacrylates and methacrylates of the foregoing acrylates.

Other monomers that are useful for forming the first and/or second polymer layers include vinyl ethers, vinyl naphthylene, acrylonitrile, and mixtures thereof.

The desired chemical composition and thickness of the first polymer layer 224 will depend in part on the nature and surface topography of the polymeric film substrate 240. The thickness of the first and/or second polymer layers will typically be sufficient to provide a smooth, defect-free surface to which inorganic barrier layer 226 can be applied subsequently. For example, the first polymer layer may have a thickness of a few nm (for example, 2 or 3 nm) to about 5 micrometers or more. The thickness of the second polymer layer may also be in this range and may, in some embodiments, be thinner than the first polymer layer.

Inorganic barrier layer 226 can be formed from a variety of materials. Useful materials include metals, metal oxides, metal nitrides, metal carbides, metal oxynitrides, metal oxyborides, and combinations thereof. Exemplary metal oxides include silicon oxides such as silica, aluminum oxides such as alumina, titanium oxides such as titania, indium oxides, tin oxides, indium tin oxide (ITO), tantalum oxide, zirconium oxide, niobium oxide, and combinations thereof. Other exemplary materials include boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. In some embodiments, the inorganic barrier layer comprises at least one of ITO, silicon oxide, or aluminum oxide. In some embodiments, with the proper selection of the relative proportions of each elemental constituent, ITO can be electrically conductive. The inorganic barrier layers can be formed, for example, using techniques employed in the film metallizing art such as sputtering (for example, cathode or planar magnetron sputtering, dual AC planar magnetron sputtering or dual AC rotatable magnetron sputtering), evaporation (for example, resistive or electron beam evaporation and energy enhanced analogs of resistive or electron beam evaporation including ion beam and plasma assisted deposition), chemical vapor deposition, plasma-enhanced chemical vapor deposition, and plating. In some embodiments, the inorganic barrier layers are formed using sputtering, for example, reactive sputtering. Enhanced barrier properties may be observed when the inorganic layer is formed by a high energy deposition technique such as sputtering compared to lower energy techniques such as conventional vapor deposition processes. Without being bound by theory, it is believed that the enhanced properties are due to the condensing species arriving at the substrate with greater kinetic energy, leading to a lower void fraction as a result of compaction.

The desired chemical composition and thickness of each inorganic barrier layer will depend in part on the nature and surface topography of the underlying layer and on the desired optical properties for the barrier film. The inorganic barrier layers typically are sufficiently thick so as to be continuous, and sufficiently thin so as to ensure that the barrier films and assemblies disclosed herein will have the desired degree of visible light transmission and flexibility. The physical thickness (as opposed to the optical thickness) of each inorganic barrier layer may be, for example, about 3 nm to about 150 nm (in some embodiments, about 4 nm to about 75 nm). The inorganic barrier layer typically has an average transmission over the visible portion of the spectrum of at least about 75% (in some embodiments at least about 80, 85, 90, 92, 95, 97, or 98%) measured along the normal axis. In some embodiments, the inorganic barrier layer has an average transmission over a range of 400 nm to 1400 nm of at least about 75% (in some embodiments at least about 80, 85, 90, 92, 95, 97, or 98%). Useful inorganic barrier layers typically are those that do not interfere with absorption of visible or infrared light, for example, by photovoltaic cells.

Additional inorganic barrier layers and polymer layers can be present if desired. In embodiments wherein more than one inorganic barrier layer is present, the inorganic barrier layers do not have to be the same or have the same thickness. When more than one inorganic barrier layer is present, the inorganic barrier layers can respectively be referred to as the "first inorganic barrier layer" and "second inorganic barrier layer". Additional "polymer layers" may be present in between additional inorganic barrier layers. For example, the barrier film may have several alternating inorganic barrier layers and polymer layers. Each unit of inorganic barrier layer combined with a polymer layer is referred to as a dyad, and the barrier film can include any number of dyads. It can also include various types of optional layers between the dyads.

Surface treatments or tie layers can be applied between any of the polymer layers or inorganic barrier layers, for example, to improve smoothness or adhesion. Useful surface treatments include electrical discharge in the presence of a suitable reactive or non-reactive atmosphere (e.g., plasma, glow discharge, corona discharge, dielectric barrier discharge or atmospheric pressure discharge); chemical pretreatment; or flame pretreatment. Exemplary useful tie layers include a separate polymeric layer or a metal-containing layer such as a layer of metal, metal oxide, metal nitride or metal oxynitride. The tie layer may have a thickness of a few nanometers (nm) (e.g., 1 or 2 nm) to about 50 nm or more.

In some embodiments, one of the polymer layers (e.g., the top layer) in the barrier film can be formed from co-depositing a silane (e.g., an amino silane or cyclic azasilane) and a radiation-curable monomer (e.g., any of the acrylates listed above). Co-depositing includes co-evaporating and evaporating a mixture of the silane and the monomer. Cyclic azasilanes are ring compounds, wherein at least one of the ring members is a nitrogen and at least one of the ring members is a silicon, and wherein the ring contains at least one nitrogen-to-silicon bond. In some embodiments, the cyclic azasilane is represented by the general formula

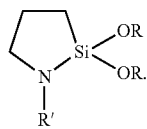

In other embodiments, the cyclic azasilane is represented by the general formula

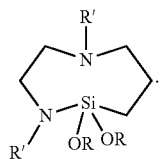

In either of these embodiments, each R is independently alkyl having up to 12, 6, 4, 3, or 2 carbon atoms and R' is hydrogen, alkyl, or alkenyl with alkyl and alkenyl each having up to 12, 6, 4, 3, or 2 carbon atoms and optionally substituted by amino. Exemplary cyclic azasilanes include 2,2-dimethoxy-N-butyl-1-aza-2-silacyclopentane, 2-methyl-2-methoxy-N-(2-aminoethyl)-1-aza-2-silacyclopentane, 2,2-diethoxy-N-(2-aminoethyl)-1-aza-2-silacyclopentane, 2,2-dimethyl-N-allyl-1-aza-2-silacyclopentane, 2,2-dimethoxy-N-methyl-1-aza-2-silacyclopentane, 2,2-diethoxy-1-aza-2-silacyclopentane, 2,2-dimethoxy-1,6-diaza-2-silacyclooctane, and N-methyl-1-aza-2,2,4-trimethylsilacyclopentane. When the cyclic azasilane is placed in the presence of a hydroxyl (e.g., silanol) group it quickly reacts to form a Si—O—Si (siloxane) linkage from the oxide surface to the co-condensed pre-polymer while the nitrogen moiety becomes a reactive amine on the other end of the molecule that can bond with pre-polymer compound(s) during polymerization. Amino silanes, which have the general formula $Z2N-L-SiY_xY'_{3-x}$, wherein each Z is independently hydrogen or alkyl having up to 12 carbon atoms, L is alkylene having up to 12 carbon atoms, Y is a hydrolysable group (e.g., alkoxy having up to 12 carbon atoms or halogen), and Y' is a non-hydrolysable group (e.g., alkyl having up to 12 carbon atoms), have silane groups capable of forming siloxane bonds with a metal oxide surface and amino groups capable of reacting with polymerizable compounds (e.g., acrylates). Exemplary amino silanes include (e.g., 3-aminopropyltrimethoxysilane; 3-aminopropyltriethoxysilane; 3-(2-aminoethyl)aminopropyltrimethoxysilane; N-(2-aminoethyl)-3-aminopropylmethyldimethoxysilane, bis-(gamma-triethoxysilylpropyl)amine; N-(2-aminoethyl)-3-aminopropyltributoxysilane; 6-(aminohexylaminopropyl)trimethoxysilane; 4-aminobutyltrimethoxysilane; 4-aminobutyltriethoxysilane; 3-aminopropyltris(methoxyethoxyethoxy)silane; 3-aminopropylmethyldiethoxysilane; 3-(N-methylamino) propyltrimethoxysilane; N-(2-aminoethyl)-3-aminopropylmethyldimethoxysilane; N-(2-aminoethyl)-3-aminopropylmethyldiethoxysilane; N-(2-aminoethyl)-3-aminopropyltrimethoxysilane; N-(2-aminoethyl)-3-aminopropyltriethoxysilane; 3-aminopropylmethyldiethoxysilane; 3-aminopropylmethyldimethoxysilane; 3-aminopropyldimethylmethoxysilane; and 3-aminopropyldimethylethoxysilane). Accordingly, in some embodiments, the barrier film comprises an inorganic layer that shares a chemical bond (e.g., a siloxane bond) with one or more organic layers. For example, a hydroxyl group derived from a metal oxide can react with a silane group on an amino silane or cyclic azasilane. The amount of water vapor present in a multi-process vacuum chamber, for example, can be controlled to promote the formation of such hydroxyl groups in high enough surface concentration to provide increased bonding sites. With residual gas monitoring and the use of water vapor sources, for example, the amount of water vapor in a vacuum chamber can be controlled to ensure adequate generation of hydroxyl (e.g., Si—OH) groups.

With the addition of silanes, the peel strength of the coating is greatly improved and peel strength adhesion is retained after exposure to high heat and humidity conditions. Additionally, the addition of silane eliminates the need for a tie layer, which greatly simplifies the coating process and barrier coating stack construction. The resulting barrier coatings retain high barrier properties and optical transmission performance. For additional details on barrier films containing cyclic azasilanes, see, for example, co-pending application having U.S. Ser. No. 12/829,525, filed on Jul. 2, 2010, the disclosure of which is incorporated by reference herein in its entirety.

In some embodiments, useful barrier films comprise plasma deposited polymer layers (for example, diamond-like layers) such as those disclosed in U.S. Pat. App. Pub. No. 2007-0020451 (Padiyath et al.). For example, barrier films can be made by overcoating a first polymer layer on the polymeric film substrate, and a plasma deposited polymer layer overcoated on the first polymer layer. The first polymer layer may be as described in any of the above embodiments of the first polymer layer. The plasma deposited polymer layer may be, for example, a diamond-like carbon layer or a diamond-like glass. The term "overcoated" to describe the position of a layer with respect to a substrate or other element of a barrier film, refers to the layer as being atop the substrate or other element, but not necessarily contiguous to either the substrate or the other element. The term "diamond-like glass" (DLG) refers to substantially or completely amorphous glass including carbon and silicon, and optionally including one or more additional components selected from the group including hydrogen, nitrogen, oxygen, fluorine, sulfur, titanium, and copper. Other elements may be present in certain embodiments. The amorphous diamond-like glass films may contain clustering of atoms to give it a short-range order but are essentially devoid of medium and long range ordering that lead to micro or macro crystallinity, which can adversely scatter radiation having wavelengths of from 180 nm to 800 nm. The term "diamond-like carbon" (DLC) refers to an amorphous film or coating comprising approximately 50 to 90 atomic percent carbon and approximately 10 to 50 atomic percent hydrogen, with a gram atom density of between approximately 0.20 and approximately 0.28 gram atoms per cubic centimeter, and composed of approximately 50% to approximately 90% tetrahedral bonds.

In some embodiments, the barrier film can have multiple layers made from alternating DLG or DLC layers and polymer layers (e.g., first and second polymer layers as described above) overcoated on the polymeric film substrate. Each unit including a combination of a polymer layer and a DLG or DLC layer is referred to as a dyad, and the assembly can include any number of dyads. It can also include various types of optional layers between the dyads. Adding more layers in the barrier film may increase its imperviousness to oxygen, moisture, or other contaminants and may also help cover or encapsulate defects within the layers.

In some embodiments, the diamond-like glass comprises, on a hydrogen-free basis, at least 30% carbon, a substantial amount of silicon (typically at least 25%) and no more than 45% oxygen. The unique combination of a fairly high amount of silicon with a significant amount of oxygen and a substantial amount of carbon makes these films highly transparent and flexible. Diamond-like glass thin films may have a variety of light transmissive properties. Depending upon the composition, the thin films may have increased transmissive properties at various frequencies. However, in some embodiments, the thin film (when approximately one micron thick) is at least 70% transmissive to radiation at substantially all wavelengths from about 250 nm to about 800 nm (e.g., 400 nm to about 800 nm). A transmission of 70% for a one micron thick film corresponds to an extinction coefficient (k) of less than 0.02 in the visible wavelength range between 400 nm and 800 nm.

In creating a diamond-like glass film, various additional components can be incorporated to alter and enhance the properties that the diamond-like glass film imparts to the substrate (for example, barrier and surface properties). The additional components may include one or more of hydrogen, nitrogen, fluorine, sulfur, titanium, or copper. Other additional components may also be of benefit. The addition of hydrogen promotes the formation of tetrahedral bonds. The addition of fluorine may enhance barrier and surface properties of the diamond-like glass film, including the ability to be dispersed in an incompatible matrix. Sources of fluorine include compounds such as carbon tetrafluoride ($CF_4$), sulfur hexafluoride ($SF_6$), $C_2F_6$, $C_3F_8$, and $C_4F_{10}$. The addition of nitrogen may be used to enhance resistance to oxidation and to increase electrical conductivity. Sources of nitrogen include nitrogen gas ($N_2$), ammonia ($NH_3$), and hydrazine ($N_2H_6$). The addition of sulfur can enhance adhesion. The addition of titanium tends to enhance adhesion and diffusion and barrier properties.

Various additives to the DLC film can be used. In addition to nitrogen or fluorine, which may be added for the reasons described above with regard to diamond-like glass, oxygen and silicon may be added. The addition of silicon and oxygen to the DLC coating tend to improve the optical transparency and thermal stability of the coating. Sources of oxygen include oxygen gas ($O_2$), water vapor, ethanol, and hydrogen peroxide. Sources of silicon preferably include silanes such as $SiH_4$, $Si_2H_6$, and hexamethyldisiloxane.

Additives to DLG or DLC films described above may be incorporated into the diamond-like matrix or attached to the surface atomic layer. If the additives are incorporated into the diamond-like matrix they may cause perturbations in the density and/or structure, but the resulting material is essentially a densely packed network with diamond-like carbon characteristics (e.g., chemical inertness, hardness, and barrier properties). If the additive concentration is too large (e.g., greater than 50 atomic percent relative to the carbon concentration) the density will be affected and the beneficial properties of the diamond-like carbon network will be lost. If the additives are attached to the surface atomic layers they will alter only the surface structure and properties. The bulk properties of the diamond-like carbon network will be preserved.

Plasma deposited polymers such as diamond-like glass and diamond-like carbon can be synthesized from a plasma by using precursor monomers in the gas phase at low temperatures. Precursor molecules are broken down by energetic electrons present in the plasma to form free radical species. These free radical species react at the substrate surface and lead to polymeric thin film growth. Due to the non-specificity of the reaction processes in both the gas phase and the substrate, the resulting polymer films are typically highly cross-linked and amorphous in nature. For additional information regarding plasma deposited polymers, see, for example, H. Yasuda, "Plasma Polymerization," Academic Press Inc., New York (1985); R.d'Agostino (Ed), "Plasma Deposition, Treatment & Etching of Polymers," Academic Press, New York (1990); and H. Biederman and Y. Osada, "Plasma Polymerization Processes," Elsever, N.Y. (1992).

Typically, plasma deposited polymer layers described herein have an organic nature due to the presence of hydrocarbon and carbonaceous functional groups such as $CH_3$, $CH_2$, CH, Si—C, Si—$CH_3$, Al—C, Si—O—$CH_3$, etc. The plasma deposited polymer layers are substantially sub-stoichiometric in their inorganic component and substantially carbon-rich. In films containing silicon, for example, the oxygen to silicon ratio is typically below 1.8 (silicon dioxide has a ratio of 2.0), more typically below 1.5 for DLG, and the carbon content is at least about 10%. In some embodiments, the carbon content is at least about 20% or 25%.

Amorphous diamond-like films formed via ion enhanced plasma chemical vapor deposition (PECVD) utilizing silicone oil and an optional silane source to form the plasma as described, for example, in U.S. Pat. App. Pub. No. 2008-0196664 (David et al.), can also be useful in barrier films. The terms "silicone", "silicone oil", or "siloxanes" are used interchangeably and refer to oligomeric and higher molecular weight molecules having a structural unit $R_2SiO$ in which R is independently selected from hydrogen, ($C_1$-$C_8$)alkyl, ($C_5$-$C_{18}$)aryl, ($C_6$-$C_{26}$)arylalkyl, or ($C_6$-$C_{26}$)alkylaryl. These can also be referred to as polyorganosiloxanes and include chains of alternating silicon and oxygen atoms (—O—Si—

O—Si—O—) with the free valences of the silicon atoms joined usually to R groups, but may also be joined (crosslinked) to oxygen atoms and silicon atoms of a second chain, forming an extended network (high MW). In some embodiments, a siloxane source such as vaporized silicone oil is introduced in quantities such that the resulting plasma formed coatings are flexible and have high optical transmission. Any additional useful process gases, such as oxygen, nitrogen and/or ammonia, for example, can be used with the siloxane and optional silane to assist in maintaining the plasma and to modify the properties of the amorphous diamond-like film layers.

In some embodiments, combinations of two or more different plasma deposited polymers can be used. For example, different plasma deposited polymer layers formed by changing or pulsing the process gases that form the plasma for depositing the polymer layer. In another example, a first layer of a first amorphous diamond-like film can be formed and then a second layer of a second amorphous diamond-like film can be formed on the first layer, where the first layer has a different composition than the second layer. In some embodiments, a first amorphous diamond-like film layer is formed from a silicone oil plasma and then a second amorphous diamond-like film layer is formed from a silicone oil and silane plasma. In other embodiments, two or more amorphous diamond-like films layers of alternating composition are formed to create the amorphous diamond-like film.

Plasma deposited polymers such as diamond-like glass and diamond-like carbon can be any useful thickness. In some embodiments, the plasma deposited polymer can have a thickness of at least 500 Angstroms, or at least 1,000 Angstroms. In some embodiments, the plasma deposited polymer can have a thickness in a range from 1,000 to 50,000 Angstroms, from 1,000 to 25,000 Angstroms, or from 1,000 to 10,000 Angstroms.

Other plasma deposition processes for preparing useful barrier films 120 such as carbon-rich films, silicon-containing films, or combinations thereof are disclosed, for example, in U.S. Pat. No. 6,348,237 (Kohler et al.). Carbon-rich films may contain at least 50 atom percent carbon, and typically about 70-95 atom percent carbon, 0.1-20 atom percent nitrogen, 0.1-15 atom percent oxygen, and 0.1-40 atom percent hydrogen. Such carbon-rich films can be classified as "amorphous", "hydrogenated amorphous", "graphitic", "i-carbon", or "diamond-like", depending on their physical and chemical properties. Silicon-containing films are usually polymeric and contain in random composition silicon, carbon, hydrogen, oxygen, and nitrogen.

Carbon-rich films and silicon-containing films can be formed by means of plasma interaction with a vaporized organic material, which is normally a liquid at ambient temperature and pressure. The vaporized organic material is typically capable of condensing in a vacuum of less than about 1 Torr (130 Pa). The vapors are directed toward the polymeric film substrate in a vacuum (e.g., in a conventional vacuum chamber) at a negatively charged electrode as described above for plasma polymer deposition. A plasma (for example, an argon plasma or a carbon-rich plasma as described in U.S. Pat. No. 5,464,667 (Kohler et al.)) and at least one vaporized organic material are allowed to interact during formation of a film. The plasma is one that is capable of activating the vaporized organic material. The plasma and vaporized organic material can interact either on the surface of the substrate or before contacting the surface of the substrate. Either way, the interaction of the vaporized organic material and the plasma provides a reactive form of the organic material (for example, loss of methyl group from silicone) to enable densification of the material upon formation of the film, as a result of polymerization and/or crosslinking, for example. Significantly, the films are prepared without the need for solvents.

The formed films can be uniform multi-component films (for example, one layer coatings produced from multiple starting materials), uniform one-component films, and/or multilayer films (for example, alternating layers of carbon-rich material and silicone materials). For example, using a carbon-rich plasma in one stream from a first source and a vaporized high molecular weight organic liquid such as dimethylsiloxane oil in another stream from a second source, a one-pass deposition procedure may result in a multilayer construction of the film (e.g., a layer of a carbon-rich material, a layer of dimethylsiloxane that is at least partially polymerized, and an intermediate or interfacial layer of a carbon/dimethylsiloxane composite). Variations in system arrangements result in the controlled formation of uniform multi-component films or layered films with gradual or abrupt changes in properties and composition as desired. Uniform coatings of one material can also be formed from a carrier gas plasma, such as argon, and a vaporized high molecular weight organic liquid, such as dimethylsiloxane oil.

Other useful barrier films 120 comprise films having a graded-composition barrier coating such as those described in U.S. Pat. No. 7,015,640 (Schaepkens et al.). Films having a graded-composition barrier coating can be made by depositing reaction or recombination products of reacting species onto polymeric film substrate 130. Varying the relative supply rates or changing the identities of the reacting species results in a coating that has a graded composition across its thickness. Suitable coating compositions are organic, inorganic, or ceramic materials. These materials are typically reaction or recombination products of reacting plasma species and are deposited onto the substrate surface. Organic coating materials typically comprise carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide; nitride; carbide; boride; or combinations thereof of elements of Groups IIA, IIIA, IVA, VA, VIA, VIIA, IB, and IIB; metals of Groups IIIB, IVB, and VB; and rare-earth metals. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HIVIDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. The choice of the particular reactants is within the skills of the artisans. A graded composition of the coating can be obtained by changing the compositions of the reactants fed into the reactor chamber during the deposition of reaction products to form the coating or by using overlapping deposition zones, for example, in a web process. The coating may be formed by one of many deposition techniques, such as plasma-enhanced chemical-vapor deposition (PECVD), radio-frequency plasma-enhanced chemical-vapor deposition (RFPECVD), expanding thermal-plasma chemical-vapor deposition (ETPCVD), sputtering including reactive sputtering, electron-cyclotron-resonance plasma-enhanced chemical-vapor deposition (ECRPECVD), inductively coupled plasma-enhanced chemical-vapor deposition (ICPECVD), or combinations thereof. Coating thickness is typically in the range from about 10 nm to about 10000 nm, in some embodiments from about 10 nm to about 1000 nm, and in some embodiments from about 10 nm to about 200 nm. The barrier film can have an average transmission over the visible portion of the spectrum of at least about 75% (in some embodiments at least about 80, 85, 90, 92, 95, 97, or 98%) measured along the normal axis. In some embodiments, the barrier film has an average transmission over a range of 400 nm to 1400 nm of at least about 75% (in some embodiments at least about 80, 85, 90, 92, 95, 97, or 98%).

Other suitable barrier films include thin and flexible glass laminated on a polymer film, and glass deposited on a polymeric film.

Pressure Sensitive Adhesive

PSAs are well known to those of ordinary skill in the art to possess properties including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as PSAs are polymers designed and formulated to exhibit the requisite viscoelastic properties resulting in a desired balance of tack, peel adhesion, and shear holding power.

One method useful for identifying pressure sensitive adhesives is the Dahlquist criterion. This criterion defines a pressure sensitive adhesive as an adhesive having a 1 second creep compliance of greater than $1\times10^{-6}$ cm$^2$/dyne as described in "Handbook of Pressure Sensitive Adhesive Technology", Donatas Satas (Ed.), $2^{nd}$ Edition, p. 172, Van Nostrand Reinhold, New York, N.Y., 1989, incorporated herein by reference. Alternatively, since modulus is, to a first approximation, the inverse of creep compliance, pressure sensitive adhesives may be defined as adhesives having a storage modulus of less than about $1\times10^{6}$ dynes/cm$^2$.

PSAs useful for practicing the present disclosure typically do not flow and have sufficient barrier properties to provide slow or minimal infiltration of oxygen and moisture through the adhesive bond line. Also, the PSAs disclosed herein are generally transmissive to visible and infrared light such that they do not interfere with absorption of visible light, for example, by photovoltaic cells. The PSAs may have an average transmission over the visible portion of the spectrum of at least about 75% (in some embodiments at least about 80, 85, 90, 92, 95, 97, or 98%) measured along the normal axis. In some embodiments, the PSA has an average transmission over a range of 400 nm to 1400 nm of at least about 75% (in some embodiments at least about 80, 85, 90, 92, 95, 97, or 98%). Exemplary PSAs include acrylates, silicones, polyisobutylenes, ureas, and combinations thereof. Some useful commercially available PSAs include UV curable PSAs such as those available from Adhesive Research, Inc., Glen Rock, Pa., under the trade designations "ARclear 90453" and "ARclear 90537" and acrylic optically clear PSAs available, for example, from 3M Company, St. Paul, Minn., under the trade designations "OPTICALLY CLEAR LAMINATING ADHESIVE 8171", "OPTICALLY CLEAR LAMINATING ADHESIVE 8172", and "OPTICALLY CLEAR LAMINATING ADHESIVE 8172P".

In some embodiments, PSAs useful for practicing the present disclosure have a modulus (tensile modulus) up to 50,000 psi ($3.4\times10^8$ Pa). The tensile modulus can be measured, for example, by a tensile testing instrument such as a testing system available from Instron, Norwood, Mass., under the trade designation "INSTRON 5900". In some embodiments, the tensile modulus of the PSA is up to 40,000, 30,000, 20,000, or 10,000 psi ($2.8\times10^8$ Pa, $2.1\times10^8$ Pa, $1.4\times10^8$ Pa, or $6.9\times10^8$ Pa).

In some embodiments, PSAs useful for practicing the present disclosure is are acrylic PSAs. As used herein, the term "acrylic" or "acrylate" includes compounds having at least one of acrylic or methacrylic groups. Useful acrylic PSAs can be made, for example, by combining at least two different monomers (first and second monomers). Exemplary suitable first monomers include 2-methylbutyl acrylate, 2-ethylhexyl acrylate, isooctyl acrylate, lauryl acrylate, n-decyl acrylate, 4-methyl-2-pentyl acrylate, isoamyl acrylate, sec-butyl acrylate, and isononyl acrylate. Exemplary suitable second monomers include a (meth)acrylic acid (e.g., acrylic acid, methacrylic acid, itaconic acid, maleic acid, and fumaric acid), a (meth)acrylamide (e.g., acrylamide, methacrylamide, N-ethyl acrylamide, N-hydroxyethyl acrylamide, N-octyl acrylamide, N-t-butyl acrylamide, N,N-dimethyl acrylamide, N,N-diethyl acrylamide, and N-ethyl-N-dihydroxyethyl acrylamide), a (meth)acrylate (e.g., 2-hydroxyethyl acrylate or methacrylate, cyclohexyl acrylate, t-butyl acrylate, or isobornyl acrylate), N-vinyl pyrrolidone, N-vinyl caprolactam, an alpha-olefin, a vinyl ether, an allyl ether, a styrenic monomer, or a maleate.

Acyrlic PSAs may also be made by including cross-linking agents in the formulation. Exemplary cross-linking agents include copolymerizable polyfunctional ethylenically unsaturated monomers (e.g., 1,6-hexanediol diacrylate, trimethylolpropane triacrylate, pentaerythritol tetraacrylate, and 1,2-ethylene glycol diacrylate); ethylenically unsaturated compounds which in the excited state are capable of abstracting hydrogen (e.g., acrylated benzophenones such as described in U.S. Pat. No. 4,737,559 (Kellen et al.), p-acryloxy-benzophenone, which is available from Sartomer Company, Exton, Pa., monomers described in U.S. Pat. No. 5,073,611 (Rehmer et al.) including p-N-(methacryloyl-4-oxapentamethylene)-carbamoyloxybenzophenone, N-(benzoyl-p-phenylene)-N'-(methacryloxymethylene)-carbodiimide, and p-acryloxy-benzophenone); nonionic crosslinking agents which are essentially free of olefinic unsaturation and is capable of reacting with carboxylic acid groups, for example, in the second monomer described above (e.g., 1,4-bis(ethyleneiminocarbonylamino)benzene; 4,4-bis(ethyleneiminocarbonylamino)diphenylmethane; 1,8-bis(ethyleneiminocarbonylamino)octane; 1,4-tolylene diisocyanate; 1,6-hexamethylene diisocyanate, N,N'-bis-1,2-propyleneisophthalamide, diepoxides, dianhydrides, bis(amides), and bis(imides)); and nonionic crosslinking agents which are essentially free of olefinic unsaturation, are noncopolymerizable with the first and second monomers, and, in the excited state, are capable of abstracting hydrogen (e.g., 2,4-bis(trichloromethyl)-6-(4-methoxy)phenyl)-s-triazine; 2,4-bis(trichloromethyl)-6-(3,4-dimethoxy)phenyl)-s-triazine; 2,4-bis(trichloromethyl)-6-(3,4,5-trimethoxy)phenyl)-s-triazine; 2,4-bis(trichloromethyl)-6-(2,4-dimethoxy)phenyl)-s-triazine; 2,4-bis(trichloromethyl)-6-(3-methoxy)phenyl)-s-triazine as described in U.S. Pat. No. 4,330,590 (Vesley); 2,4-bis(trichloromethyl)-6-naphthenyl-s-triazine and 2,4-bis(trichloromethyl)-6-(4-methoxy)naphthenyl-s-triazine as described in U.S. Pat. No. 4,329,384 (Vesley)).

Typically, the first monomer is used in an amount of 80-100 parts by weight (pbw) based on a total weight of 100 parts of copolymer, and the second monomer is used in an amount of 0-20 pbw based on a total weight of 100 parts of copolymer. The crosslinking agent can be used in an amount of 0.005 to 2 weight percent based on the combined weight of the monomers, for example from about 0.01 to about 0.5 percent by weight or from about 0.05 to 0.15 percent by weight.

The acrylic PSAs useful for practicing the present disclosure can be prepared, for example, by a solvent free, bulk, free-radical polymerization process (e.g., using heat, electron-beam radiation, or ultraviolet radiation). Such polymerizations are typically facilitated by a polymerization initiator (e.g., a photoinitiator or a thermal initiator). Examplary suitable photoinitiators include benzoin ethers such as benzoin methyl ether and benzoin isopropyl ether, substituted benzoin ethers such as anisoin methyl ether, substituted acetophenones such as 2,2-dimethoxy-2-phenylacetophenone, and substituted alpha-ketols such as 2-methyl-2-hydroxypropiophenone. Examples of commercially available photoinitiators include IRGACURE 651 and DAROCUR 1173, both available from Ciba-Geigy Corp., Hawthorne, N.Y., and LUCERIN TPO from BASF, Parsippany, N.J. Examples of suitable thermal initiators include, but are not limited to, peroxides such as dibenzoyl peroxide, dilauryl peroxide, methyl ethyl ketone peroxide, cumene hydroperoxide, dicyclohexyl peroxydicarbonate, as well as 2,2-azo-bis(isobutryonitrile), and t-butyl perbenzoate. Examples of commercially available thermal initiators include VAZO 64, available from ACROS Organics, Pittsburgh, Pa., and LUCIDOL 70, available from Elf Atochem North America, Philadelphia, Pa. The polymerization initiator is used in an amount effective to facilitate polymerization of the monomers (e.g., 0.1 part to about 5.0 parts or 0.2 part to about 1.0 part by weight, based on 100 parts of the total monomer content).

If a photocrosslinking agent is used, the coated adhesive can be exposed to ultraviolet radiation having a wavelength of about 250 nm to about 400 nm. The radiant energy in this range of wavelength required to crosslink the adhesive is about 100 millijoules/cm$^2$ to about 1,500 millijoules/cm$^2$, or more specifically, about 200 millijoules/cm$^2$ to about 800 millijoules/cm$^2$.

A useful solvent-free polymerization method is disclosed in U.S. Pat. No. 4,379,201 (Heilmann et al.). Initially, a mixture of first and second monomers can be polymerized with a portion of a photoinitiator by exposing the mixture to UV radiation in an inert environment for a time sufficient to form a coatable base syrup, and subsequently adding a crosslinking agent and the remainder of the photoinitiator. This final syrup containing a crosslinking agent (e.g., which may have a Brookfield viscosity of about 100 centipoise to about 6000 centipoise at 23 C, as measured with a No. 4 LTV spindle, at 60 revolutions per minute) can then be coated onto the second polymeric film substrate. Once the syrup is coated onto the second polymeric film substrate, further polymerization and crosslinking can be carried out in an inert environment (e.g., nitrogen, carbon dioxide, helium, and argon, which exclude oxygen). A sufficiently inert atmosphere can be achieved by covering a layer of the photoactive syrup with a polymeric film, such as silicone-treated PET film, that is transparent to UV radiation or e-beam and irradiating through the film in air.

In some embodiments, PSAs useful for practicing the present disclosure comprise polyisobutylene. The polyisobutylene may have a polyisobutylene skeleton in the main or a side chain. Useful polyisobutylenes can be prepared, for example, by polymerizing isobutylene alone or in combination with n-butene, isoprene, or butadiene in the presence of a Lewis acid catalyst (for example, aluminum chloride or boron trifluoride).

Useful polyisobutylene materials are commercially available from several manufacturers. Homopolymers are commercially available, for example, under the trade designations "OPPANOL" and "GLISSOPAL" (e.g., OPPANOL B15, B30, B50, B100, B150, and B200 and GLISSOPAL 1000, 1300, and 2300) from BASF Corp. (Florham Park, N.J.); "SDG", "JHY", and "EFROLEN" from United Chemical Products (UCP) of St. Petersburg, Russia. Polyisobutylene copolymers can be prepared by polymerizing isobutylene in the presence of a small amount (e.g., up to 30, 25, 20, 15, 10, or 5 weight percent) of another monomer such as, for example, styrene, isoprene, butene, or butadiene. Exemplary suitable isobutylene/isoprene copolymers are commercially available under the trade designations "EXXON BUTYL" (e.g., EXXON BUTYL 065, 068, and 268) from Exxon Mobil Corp., Irving, Tex.; "BK-1675N" from UCP and "LANXESS" (e.g., LANXESS BUTYL 301, LANXESS BUTYL 101-3, and LANXESS BUTYL 402) from Sarnia, Ontario, Canada. Exemplary suitable isobutylene/styrene block copolymers are commercially available under the trade designation "SIBSTAR" from Kaneka (Osaka, Japan). Other exemplary suitable polyisobutylene resins are commercially available, for example, from Exxon Chemical Co. under the trade designation "VISTANEX", from Goodrich Corp., Charlotte, N.C., under the trade designation "HYCAR", and from Japan Butyl Co., Ltd., Kanto, Japan, under the trade designation "JSR BUTYL".

A polyisobutylene useful for practicing the present disclosure may have a wide variety of molecular weights and a wide variety of viscosities. Polyisobutylenes of many different molecular weights and viscosities are commercially available.

In some embodiments of PSAs comprising polyisobutylene, the PSA further comprises a hydrogenated hydrocarbon tackifier (in some embodiments, a poly(cyclic olefin)). In some of these embodiments, about 5 to 90 percent by weight the hydrogenated hydrocarbon tackifier (in some embodiments, the poly(cyclic olefin)) is blended with about 10 to 95 percent by weight polyisobutylene, based on the total weight of the PSA composition. Useful polyisobutylene PSAs include adhesive compositions comprising a hydrogenated poly(cyclic olefin) and a polyisobutylene resin such as those disclosed in Int. Pat. App. Pub. No. WO 2007/087281 (Fujita et al.).

The "hydrogenated" hydrocarbon tackifier component may include a partially hydrogenated resin (e.g., having any hydrogenation ratio), a completely hydrogenated resin, or a combination thereof. In some embodiments, the hydrogenated hydrocarbon tackifier is completely hydrogenated, which may lower the moisture permeability of the PSA and improve the compatibility with the polyisobutylene resin. The hydrogenated hydrocarbon tackifiers are often hydrogenated cycloaliphatic resins, hydrogenated aromatic resins, or combinations thereof. For example, some tackifying resins are hydrogenated C9-type petroleum resins obtained by copolymerizing a C9 fraction produced by thermal decomposition of petroleum naphtha, hydrogenated C5-type petroleum resins obtained by copolymerizing a C5 fraction produced by thermal decomposition of petroleum naphtha, or hydrogenated C5/C9-type petroleum resins obtained by polymerizing a combination of a C5 fraction and C9 fraction produced by thermal decomposition of petroleum naphtha. The C9 fraction can include, for example, indene, vinyltoluene, alpha-methylstyrene, beta-methylstyrene, or a combination thereof. The C5 fraction can include, for example, pentane, isoprene, piperdine, 1,3-pentadiene, or a combination thereof. In some embodiments, the hydrogenated hydrocarbon tackifier is a hydrogenated poly(cyclic olefin) polymer. In some embodiments, the hydrogenated poly(cyclic olefin) is a hydrogenated poly(dicyclopentadiene), which may provide advantages to the PSA (e.g., low moisture permeability and transparency). The tackifying resins are typically amorphous and have a weight average molecular weight no greater than 5000 grams/mole.

Some suitable hydrogenated hydrocarbon tackifiers are commercially available under the trade designations "ARKON" (e.g., ARKON P or ARKON M) from Arakawa Chemical Industries Co., Ltd. (Osaka, Japan); "ESCOREZ" from Exxon Chemical; "REGALREZ" (e.g., REGALREZ 1085, 1094, 1126, 1139, 3102, and 6108) from Eastman (Kingsport, Tenn.); "WINGTACK" (e.g., WINGTACK 95 and RWT-7850) resins from Cray Valley (Exton, Pa.); "PICCOTAC" (e.g., PICCOTAC 6095-E, 8090-E, 8095, 8595, 9095, and 9105) from Eastman; "CLEARON", in grades P, M and K, from Yasuhara Chemical, Hiroshima, Japan; "FORAL AX" and "FORAL 105" from Hercules Inc., Wilmington, Del.; "PENCEL A", "ESTERGUM H", "SUPER ESTER A", and "PINECRYSTAL" from Arakawa Chemical Industries Co., Ltd., Osaka, Japan; from Arakawa Chemical Industries Co., Ltd.); "EASTOTAC H" from Eastman; and "IMARV" from Idemitsu Petrochemical Co., Tokyo, Japan.

Optionally PSAs useful for practicing the present disclosure (including any of the embodiments of PSAs described above) comprise at least one of a uv absorber (UVA), a hindered amine light stabilizer, or an antioxidant. Examples of useful UVAs include those described above in conjunction with multilayer film substrates (for example, those available from Ciba Specialty Chemicals Corporation under the trade designations "TINUVIN 328", "TINUVIN 326", "TINUVIN 783", "TINUVIN 770", "TINUVIN 479", "TINUVIN 928", and "TINUVIN 1577"). UVAs, when used, can be present in an amount from about 0.01 to 3 percent by weight based on the total weight of the pressure sensitive adhesive composition. Examples of useful antioxidants include hindered phenol-based compounds and phosphoric acid ester-based compounds and those described above in conjunction with multilayer film substrates (e.g., those available from Ciba Specialty Chemicals Corporation under the trade designations "IRGANOX 1010", "IRGANOX 1076", and "IRGAFOS 126" and butylated hydroxytoluene (BHT)). Antioxidants, when used, can be present in an amount from about 0.01 to 2 percent by weight based on the total weight of the pressure sensitive adhesive composition. Examples of useful stabilizers include phenol-based stabilizers, hindered amine-based stabilizers (e.g., including those described above in conjunction with multilayer film substrates and those available from BASF under the trade designation "CHIMASSORB" such as "CHIMASSORB 2020"), imidazole-based stabilizers, dithiocarbamate-based stabilizers, phosphorus-based stabilizers, and sulfur ester-based stabilizers. Such compounds, when used, can be present in an amount from about 0.01 to 3 percent by weight based on the total weight of the pressure sensitive adhesive composition.

In some embodiments, the PSA layer disclosed herein is at least 0.005 mm (in some embodiments, at least 0.01, 0.02, 0.03, 0.04, or 0.05 mm) in thickness. In some embodiments, the PSA layer has a thickness up to about 0.2 mm (in some embodiments, up to 0.15, 0.1, or 0.075 mm) in thickness. For example, the thickness of the PSA layer may be in a range from 0.005 mm to 0.2 mm, 0.005 mm to 0.1 mm, or 0.01 to 0.1 mm.

Once the PSA layer has been applied to the second polymeric film substrate, the exposed major surface may be temporarily protected with a release liner before being applied to a barrier film disclosed herein. Examples of useful release liners include craft paper coated with, for example, silicones; polypropylene film; fluoropolymer film such as those available from E.I. du Pont de Nemours and Co. under the trade designation "TEFLON"; and polyester and other polymer films coated with, for example, silicones or fluorocarbons.

Without wanting to be bound be theory, it is believed that the PSA layer in the barrier assembly according to the present disclosure serves to protect the barrier assembly from thermal stresses that may be caused by a high CTE second polymeric film substrate (e.g., a fluoropolymer). Furthermore, even in embodiments wherein the CTE mismatch between the first and second polymeric film substrates is relatively low (e.g., less than 40 ppm/K) the PSA layer serves as a convenient means for attaching the second polymeric film substrate to the barrier film deposited on the first polymeric film substrate (e.g., having a CTE of up to 50 ppm/K). When the PSA layer contains at least one of UVA, HALS, or anti-oxidants, it can further provide protection to the barrier film from degradation by UV light.

Other Optional Features

Optionally, assemblies according to the present disclosure can contain desiccant.

In some embodiments, assemblies according to the present disclosure are essentially free of desiccant. "Essentially free of desiccant" means that desiccant may be present but in an amount that is insufficient to effectively dry a photovoltaic module. Assemblies that are essentially free of desiccant include those in which no desiccant is incorporated into the assembly.

Various functional layers or coatings can optionally be added to the assemblies disclosed herein to alter or improve their physical or chemical properties. Exemplary useful layers or coatings include visible and infrared light-transmissive conductive layers or electrodes (e.g., of indium tin oxide); antistatic coatings or films; flame retardants; abrasion resistant or hardcoat materials; optical coatings; anti-fogging materials; anti-reflection coatings; anti-smudging coatings; polarizing coatings; anti-fouling materials; prismatic films; additional adhesives (e.g., pressure sensitive adhesives or hot melt adhesives); primers to promote adhesion to adjacent layers; additional UV protective layers; and low adhesion backsize materials for use when the barrier assembly is to be used in adhesive roll form. These components can be incorporated, for example, into the barrier film or can be applied to the surface of the polymeric film substrate.

Other optional features that can be incorporated into the assembly disclosed herein include graphics and spacer structures. For example, the assembly disclosed herein could be treated with inks or other printed indicia such as those used to display product identification, orientation or alignment information, advertising or brand information, decoration, or other information. The inks or printed indicia can be provided using techniques known in the art (e.g., screen printing, inkjet printing, thermal transfer printing, letterpress printing, offset printing, flexographic printing, stipple printing, and laser printing). Spacer structures could be included, for example, in the adhesive, to maintain specific bond line thickness.

Assemblies according to the present disclosure can conveniently be assembled using a variety of techniques. For example, the pressure sensitive adhesive layer may be a transfer PSA on a release liner or between two release liners. The transfer adhesive can be used to laminate a second polymeric film substrate to a barrier film deposited on a first polymeric film substrate after removal of the release liner(s). In another example, a PSA can be coated onto the second polymeric film substrate and/or onto the barrier film deposited on the first polymeric film substrate before laminating the first and second polymeric film substrates together. In a further example, a solvent-free adhesive formulation, for example, can be coated between the second polymeric film substrate and the barrier film deposited on the first polymeric film substrate. Subsequently, the formulation can be cured by heat or radiation as described above to provide an assembly according to the present disclosure.

Assemblies according to the present disclosure are useful, for example, for encapsulating solar devices. In some embodiments, the assembly is disposed on, above, or around a photovoltaic cell. Accordingly, the present disclosure provides a method comprising applying an assembly disclosed herein to the front surface of a photovoltaic cell. Suitable solar cells include those that have been developed with a variety of materials each having a unique absorption spectra that converts solar energy into electricity. Each type of semiconductor material will have a characteristic band gap energy which causes it to absorb light most efficiently at certain wavelengths of light, or more precisely, to absorb electromagnetic radiation over a portion of the solar spectrum. Examples of materials used to make solar cells and their solar light absorption band-edge wavelengths include: crystalline silicon single junction (about 400 nm to about 1150 nm), amorphous silicon single junction (about 300 nm to about 720 nm), ribbon silicon (about 350 nm to about 1150 nm), CIS (Copper Indium Selenide) (about 400 nm to about 1300 nm), CIGS (Copper Indium Gallium di-Selenide) (about 350 nm to about 1100 nm), CdTe (about 400 nm to about 895 nm), GaAs multi junction (about 350 nm to about 1750 nm). The shorter wavelength left absorption band edge of these semiconductor materials is typically between 300 nm and 400 nm. One skilled in the art understands that new materials are being developed for more efficient solar cells having their own unique longer wavelength absorption band-edge and the multilayer reflective film would have a corresponding reflective band-edge. In some embodiments, the assembly disclosed herein is disposed on, above, or around a CIGS cell. In some embodiments of barrier assemblies according to the present disclosure, the solar device (e.g., the photovoltaic cell) to which the assembly is applied comprises a flexible film substrate.

Barrier assemblies may also be useful, for example, for displays such as electrophoretic, electrochromic, and OLED displays.

Selected Embodiments of the Disclosure

In a first embodiment, the present disclosure provides an assembly comprising:
a barrier film interposed between:
a first polymeric film substrate having a first coefficient of thermal expansion, and
a first major surface of a pressure sensitive adhesive layer, wherein the pressure sensitive adhesive layer has a second major surface opposite the first major surface that is disposed on a second polymeric film substrate having a second coefficient of thermal expansion,
wherein the assembly is transmissive to visible and infrared light, and wherein the second coefficient of thermal expansion is at least 40 parts per million per Kelvin higher than the first coefficient of thermal expansion.

In a second embodiment, the present disclosure provides an assembly according to the first embodiment, wherein second coefficient of thermal expansion is at least 80 parts per million per Kelvin higher than the first coefficient of thermal expansion.

In a third embodiment, the present disclosure provides an assembly according to the first embodiment, wherein second coefficient of thermal expansion is at least 100 parts per million per Kelvin higher than the first coefficient of thermal expansion.

In a fourth embodiment, the present disclosure provides an assembly comprising:
a barrier film interposed between:
a first polymeric film substrate having a coefficient of thermal expansion of up to 50 parts per million per Kelvin, and
a first major surface of a pressure sensitive adhesive layer, wherein the pressure sensitive adhesive layer has a second major surface opposite the first major surface that is disposed on a second polymeric film substrate,
wherein the assembly is transmissive to visible and infrared light, and wherein the second polymeric film substrate is resistant to degradation by ultraviolet light.

In a fifth embodiment, the present disclosure provides an assembly according to the fourth embodiment, wherein the coefficient of thermal expansion of the first polymeric film substrate is up to 30 parts per million per Kelvin.

In a sixth embodiment, the present disclosure provides an assembly according to the fourth or fifth embodiment, wherein the second polymeric film substrate is a multilayer optical film.

In a seventh embodiment, the present disclosure provides an assembly according to any of the fourth to sixth embodiments, the second polymeric film substrate at least one of reflects or absorbs at least 50 percent of incident ultraviolet light over at least a 30 nanometer range in a wavelength range from at least 300 nanometers to 400 nanometers.

In an eighth embodiment, the present disclosure provides an assembly according to any one of the first to seventh embodiments, wherein a ratio of the thickness of the first polymeric film to the second polymeric film is at least 5:2.

In a ninth embodiment, the present disclosure provides an assembly according to any one of the first to eighth embodiments, wherein the assembly has a curl of up to 7 $m^{-1}$.

In a tenth embodiment, the present disclosure provides an assembly according to any one of the first to ninth embodiments, wherein the first polymeric film substrate has a thickness of at least 0.5 millimeters.

In an eleventh embodiment, the present disclosure provides an assembly according to any one of the first to tenth embodiments, wherein the pressure sensitive adhesive layer has a tensile modulus of up to $3.4 \times 10^8$ Pascals.

In a twelfth embodiment, the present disclosure provides an assembly according to any one of the first to eleventh embodiments, wherein the pressure sensitive adhesive is at least one of an acrylate, a silicone, a polyisobutylene, or a urea pressure sensitive adhesive. In some of these embodiments, the pressure sensitive adhesive is at least one of an acrylate or polyisobutylene pressure sensitive adhesive.

In a thirteenth embodiment, the present disclosure provides an assembly according to any one of the first to twelfth embodiments, wherein the pressure sensitive adhesive further comprises at least one of a uv stabilizer, a hindered amine light stabilizer, and antioxidant, or a thermal stabilizer.

In a fourteenth embodiment, the present disclosure provides an assembly according to any one of the first to thirteenth embodiments, wherein the pressure sensitive adhesive layer has a thickness of at least 0.05 millimeter.

In a fifteenth embodiment, the present disclosure provides an assembly according to any one of the first to fourteenth embodiments, wherein the second polymeric film substrate comprises a fluoropolymer.

In a sixteenth embodiment, the present disclosure provides an assembly according to the fifteenth embodiment, wherein the second polymeric film substrate comprises at least one of an ethylene-tetrafluoroethylene copolymer, a tetrafluoroethylene-hexafluoropropylene copolymer, a tetrafluoroethylene-hexafluoropropylene-vinylidene fluoride copolymer, or polyvinylidene fluoride.

In a seventeenth embodiment, the present disclosure provides an assembly according to any one of the first to sixteenth embodiments, wherein the barrier film comprises at least first and second polymer layers separated by an inorganic barrier layer.

In an eighteenth embodiment, the present disclosure provides an assembly according to the seventeenth embodiment, wherein the inorganic barrier layer is an oxide layer that shares a siloxane bond with at least one of the first or second polymer layers.

In a nineteenth embodiment, the present disclosure provides an assembly according to the seventeenth embodiment, wherein at least one of the first or second polymer layers comprises co-deposited silane and acrylate monomers.

In a twentieth embodiment, the present disclosure provides an assembly according to any one of the first to nineteenth embodiments, wherein the barrier film has at least one of an oxygen transmission rate less than 0.005 $g/m^2/day$ at 23° C. and 90% relative humidity or a water vapor transmission rate less than 0.005 $g/m^2/day$ at 50° C. and 100% relative humidity.

In a twenty-first embodiment, the present disclosure provides an assembly according to any one of the first to twentieth embodiments, wherein the assembly is disposed on, above, or around a photovoltaic cell.

In a twenty-second embodiment, the present disclosure provides an assembly according to the twenty-first embodiment, wherein the photovoltaic cell is a CIGS cell.

In a twenty-third embodiment, the present disclosure provides an assembly according to any one of the first to twenty-second embodiments, wherein the first polymeric film substrate comprises at least one of polyethylene terephthalate, polyethylene naphthalate, polyetheretherketone, polyaryletherketone, polyarylate, polyetherimide, polyarylsulfone, polyethersulfone, polyamideimide, or polyimide, any of which may optionally be heat-stabilized.

In a twenty-fourth embodiment, the present disclosure provides an assembly according to any one of the first to twenty-third embodiments, wherein the first polymeric film substrate has a tensile modulus of at least $2 \times 10^9$ Pascals.

In a twenty-fifth embodiment, the present disclosure provides an assembly according to any one of the first to twenty-fourth embodiments, wherein a ratio of a tensile modulus of the first polymeric film substrate to a tensile modulus of the second polymeric film substrate is at least 2 to 1.

In a twenty-sixth embodiment, the present disclosure provides an assembly according to the twenty-third embodiment, wherein the first polymeric film layer comprises polyethylene terephthalate.

In a twenty-seventh embodiment, the present disclosure provides an assembly according to any one of the first to twenty-sixth embodiments, wherein the second polymeric film substrate comprises ethylene-tetrafluoroethylene copolymer.

In a twenty-eighth embodiment, the present disclosure provides an assembly according to any one of the first to twenty-sixth embodiments, wherein the second polymeric film substrate comprises polyvinylidene fluoride.

In a twenty-ninth embodiment, the present disclosure provides an assembly according to any one of the first to twenty-sixth embodiments, wherein the second polymeric film substrate comprises polyvinylidene fluoride and polymethyl methacrylate.

Embodiments and advantages of this disclosure are further illustrated by the following non-limiting examples, but the particular materials and amounts thereof recited in these examples, as well as other conditions and details, should not be construed to unduly limit this disclosure.

EXAMPLES

Materials

90% Si/10% Al targets were obtained from Academy Precision Materials Inc., Albuquerque, N. Mex.

99.999% Si targets were obtained from Academy Precision Materials Inc., Albuquerque, N. Mex.

8172P: "3M OPTICALLY CLEAR ADHESIVE 8172P" commercially available from 3M Company, St. Paul, Minn.

ETFE: ethylene-tetrafluoroethylene film with surface treatment (C-treated) available from St. Gobain Performance Plastics, Wayne, N.J. under the trade name "NORTON® ETFE".

ADCO PVA: an encapsulant available from ADCO Products, Inc. Michigan Center, Mich. under the trade name "HELIOBOND PVA 100 EVA".

Etimex 496.10: an encapsulant available from Etimex, Dietenheim, Germany under the trade name "VISTASOLAR® 496.10".

"JURASOL® TL": an encapsulant available from juraplast GmbH, Reichenschwand Germany.

Madico TAPE: back-sheet film commercially available under the trade designation "TAPE" from Madico, Woburn, Mass.

N-n-butyl-aza-2,2-dimethoxysilacyclopentane was obtained from Gelest, Inc., Morrisville, Pa.

PSA-A: Pressure Sensitive Adhesive (PSA) prepared according to Example 4 from PCT Publication WO 2007087281 (Fujita et al.) except that the rubber/tackifier ratio was 75/25 instead of 60/40 and the rubber used 2 parts B80 to 1 part B50.

PVDF Film: Polyvinylidene fluoride film obtained under the trade designation (ROWLAR Film FEO-MG-000 C) from Rowland Technologies, Wallingford, Conn. Examples use 0.05 mm (0.002 inch) thick film.

"SR-833S": tricyclodecane dimethanol diacrylate available from Sartomer USA, LLC, Exton, Pa.

"SCOTCHCAL 3640 GPS": a weatherable overlaminate adhesive film available from 3M Company, St. Paul, Minn.

Stainless-steel feeler gage: roll of stainless steel gage commercially available under the trade designation "Starrett 666-1 feeler gage". Examples used a 25 micron (0.001 inch) thick gage.

Tinned copper foil: available from Ulbrich, North Haven Conn. Examples use 0.035 mm thick by 12 mm wide by 128 mm long strips.

UV-PET: UV PolyEthylene Terephthalate film available under the name "XST-6578" from DuPont Teijin Films, Hopewell Va.

T-Peel Test Method

Films having a barrier coating were cut to 20 cm (8 inch)×30.5 cm (12 inch) rectangular sections. These sections were then placed into a laminate construction containing a bottom back-sheet (Madico TAPE), a layer of encapsulant adjacent to the back-sheet, and the barrier film on top of the encapsulant layer with the barrier coating oriented towards the encapsulant. The construction was laminated at 150° C. for 12 minutes and $10^5$ Pa (1 atm) of pressure. Two pieces of plastic material about 25 mm wide by 20 cm long were placed between the barrier film and the adhesive layer along both 20 cm long edges to form unbonded edges. The resulting laminate was then cut into 25 mm wide×152 mm long strips such that one end contained the 25 mm unbonded ends that were to be placed in the clamping grips of the test machine. The two unbonded ends of film were placed in a tension testing machine according to ASTM D1876-08 "Standard Test Method for Peel Resistance of Adhesives (T-Peel Test)". A grip distance of 12.7 mm was used and a peel speed of 254 mm/min (10 inches/min) was used. T-Peel testing was completed according to ASTM D1876-08 except where otherwise stated. The average peel force was measured for three samples and averaged to produce the results Curl Test Method Curl measurements were conducted as described in "Measurement of Web Curl" by Ronald P. Swanson presented in the 2006 AWEB conference proceedings (Association of Industrial Metallizers, Coaters and Laminators, Applied Web Handling Conference Proceedings, 2006). The curl gauge was constructed by inserting a pair of pins about 3 cm long into a vertically positioned aluminum plate. The pins were positioned horizontally and spaced about 56 mm apart. The curl gauge was calibrated using cylinders with known diameters. The curvature of a cylinder is the reciprocal of the radius of the cylinder. Each cylinder was placed on top of the pins so that the cylinder was supported by the pins. The outer diameter of each the cylinder was traced on the aluminum plate to provide lines of constant known curvature. Samples about 10 cm in length and 1.3 cm in width were tested by placing the sample strips on top of the pins and determining the curvature by observing how the ends of the sample aligns with the lines of constant curvature drawn on the aluminum panel. The curl was determined as the curvature of the sample strips. The curl gauge was able to accurately measure the amount of curl to a resolution of 0.25 $m^{-1}$.

A separate pair of horizontally positioned pins that were about 3 cm long was inserted into the aluminum panel with a spacing of about 84 mm. These pins were used to measure the curvature of samples having a length of 15 cm in the same way that the first pair of pins was used to measure the curvature of samples having a 10 cm length.

Preparative Example 1—ETFE (0.13 mm)/Barrier Layer

An ethylene-tetrafluoroethylene (ETFE) support film was treated with a nitrogen plasma and then covered respectively with barrier layers of acrylate, silicon aluminum oxide (SiAlOx), silicon-sub-oxide (SiOx), a second acrylate, and a second SiAlOx layer. Examples of barrier assemblies were made on a vacuum coater similar to the coater described in U.S. Pat. No. 5,440,446 (Shaw et al.) and U.S. Pat. No. 7,018,713 (Padiyath, et al.). The individual layers were formed as follows:

(Layer 1—smoothing polymeric layer) A 300 meter long roll of 0.127 mm thick×356 mm wide surface treated (C-treated) ETFE film was loaded into a roll-to-roll vacuum processing chamber with the C-treated side facing "up" and the non-C-treated side in contact with the coating drum. The chamber was pumped down to a pressure of $2\times10^{-5}$ Torr. The web speed was set at 3.7 meters/min while maintaining the backside of the film in contact with a coating drum chilled to −10° C. With the backside of the ETFE film in contact with the drum, the front side film surface was treated with a nitrogen plasma formed by flowing 100 standard cubic centimeters per minute (sccm) of nitrogen over a magnetically enhanced cathode in the presence of 0.05 kW of power (obtained from ENI Products, Rochester, N.Y., under the trade designation "ENI DCG-100"). Immediately after the nitrogen plasma treatment, the film was coated with tricyclodecane dimethanol di-acrylate "SR-833S". The di-acrylate was degassed to a pressure of 20 mTorr (2.7 Pa) prior to coating, and pumped at a flow rate of 1.0 mL/min through an ultrasonic atomizer (Sono-Tek Corporation, Milton, N.Y.) operated at a frequency of 60 kHz into a heated vaporization chamber maintained at 260° C. The resulting monomer vapor stream condensed onto the film surface and was polymerized after electron beam exposure using a multi-filament electron gun operated at 9.0 kV and 3.0 mA to form a 725 nm acrylate layer.

(Layer 2—inorganic layer) Immediately after the acrylate deposition and with the film still in contact with the drum, a SiAlOx layer was sputter-deposited atop a 60 meter length of the plasma treated and acrylate-coated ETFE film surface. Two alternating current (AC) power supplies (obtained from Advanced Energy, Fort Collins, Colo., under the trade designation "PE-II") were used to control two pairs of cathodes, with each cathode housing two targets. Each cathode pair contained two 90% Si/10% Al targets During sputter deposition, the voltage signal from each power supply was used as an input for a proportional-integral-differential control loop to maintain a proscribed oxygen flow to each cathode pair. The AC power supplies sputtered the 90% Si/10% Al targets using 3500 watts of power each, and a total gas mixture containing 950 sccm argon and 70 sccm oxygen at a sputter pressure of 3.4 millitorr (0.45 Pa). This provided a 30 nm thick SiAlOx layer deposited atop the acrylate coating.

(Layer 3—inorganic layer) Immediately after the SiAlOx deposition and with the film still in contact with the drum, a sub-oxide of silicon (SiOx, where x<2) tie-layer was sputter deposited atop the same 60 meter length of the SiAlOx and acrylate coated ETFE film surface using a 99.999% Si target. The SiOx was sputtered using 1000 watts of pulsed-DC power (obtained from Advanced Energy) at a frequency of 90 kHz, a reverse time of 4.4 microseconds, and a reverse voltage set to 10% of the DC voltage using a gas mixture containing 10 sccm of oxygen at a sputter pressure of 2 millitorr (0.27 Pa) to provide a SiOx layer 5 nm thick atop SiAlOx layer.

(Layer 4—protective polymeric layer) Immediately after the SiOx layer deposition and with the film still in contact with the drum, a second acrylate was coated and cross linked on the same 60 meter web length using the same conditions as for the first acrylate layer but with the following exceptions: electron beam cross linking was carried out using a multi-filament cure gun operated at 9 kV and 0.41 mA. This provided a 725 nm acrylate layer.

(Layer 5—inorganic layer) In a separate pass through the roll-to-roll vacuum processing chamber and with the web at 3.7 meters/minute, a second SiAlOx was sputter deposited atop the same 60 meter web length using the same conditions as above. This provided a 30 nm thick SiAlOx layer deposited atop the second acrylate layer.

The resulting stack exhibited an average spectral transmission Tvis=91.1% (determined by averaging the percent transmission between 400 nm and 1400 nm) measured at a 0° angle of incidence. A water vapor transmission rate was measured in accordance with ASTM F-1249 at 50° C. and 100% Relative Humidity (RH) using a Water Vapor Transmission Rate (WVTR) tester obtained from MOCON, Inc., Minneapolis, Minn., under the trade designation "MOCON PERMATRAN-W" Model 700. The result was 0.007 g/m$^2$/day. The laminate was then placed in an environmental chamber at 85° C. and 85% RH for a period of 1000 hours. The average transmission after aging was determined to be 91.0% and the WVRT was determined to be 0.018 g/m$^2$/day. The results are summarized in Table 1.

Preparative Example 2—PET (0.13 mm)/Barrier Layer

A UV-stabilized polyethylene terephthalate (UV-PET described above) support film was first treated in a single pass with a nitrogen plasma on the adhesion-primed surface of the incoming web. The UV-PET film was then re-oriented in the deposition chamber to deposit in subsequent passes onto the non-primed surface of the incoming web. The non-primed surface of UV-PET was treated with a nitrogen plasma and then covered respectively with barrier layers of acrylate, SiAlOx, SiOx, a second acrylate, and a second SiAlOx layer. The individual plasmas and layers were formed as follows:

(Plasma 1—plasma treatment on primed surface of UV-PET) A 450 m long roll of 0.127 mm thick×356 mm wide UV-PET film was loaded into a roll-to-roll vacuum processing chamber with the adhesion-primed (for solvent-based materials) surface facing "up" and the non-primed side in contact with the coating drum. The chamber was pumped down to a pressure of 2×10$^{-5}$ Torr. The web speed was maintained at 3.7 meters/minute while maintaining the backside of the film in contact with a coating drum chilled to −10° C. With the backside of the UV-PET film in contact with the drum, a 350 m length of the frontside (adhesion-primed) film surface was treated with a nitrogen plasma formed by flowing 100 sccm nitrogen over a magnetically enhanced cathode in the presence of 0.02 kW of power in a similar manner to Layer 1 in Preparative Example 1.

(Layer 1—smoothing polymeric layer) The vacuum processing chamber was then vented to atmosphere and the 350 m length of plasma-treated UV-PET film was reoriented such that the non-primed side of the UV-PET was facing "up" and the adhesion-primed with plasma-treatment side of the UV-PET was in contact with the coating drum. The chamber was again pumped down to a pressure of 2×10$^{-5}$ Torr. The web speed was maintained at 3.7 meters/minute while maintaining the backside of the film in contact with a coating drum chilled to −10° C. With the backside of the UV-PET film in contact with the drum, a 350 m length of the non-primed film surface was treated with a nitrogen plasma and coated with tricyclodecane dimethanol di-acrylate in a similar manner to Layer 1 in Preparative Example 1.

(Layer 2—inorganic layer) Immediately after the acrylate deposition and with the film still in contact with the drum, a SiAlOx layer was sputter-deposited atop a 100 meter length of the plasma treated and acrylate-coated UV-PET film surface in a manner similar to Layer 2 in the previous example but with the following exceptions; the total gas mixture contained 950 sccm argon and 65 sccm oxygen at a sputter pressure of 3.5 millitorr (0.47 Pa). This provided a 30 nm thick SiAlOx layer deposited atop the acrylate coating.

(Layer 3—inorganic layer) Immediately after the SiAlOx deposition and with the film still in contact with the drum, a sub-oxide of silicon (SiOx, where x<2) tie-layer was sputter deposited atop the same 100 meter length of the SiAlOx and acrylate coated UV-PET film surface in a manner similar to Layer 3 in Preparative Example 1.

(Layer 4—protective polymeric layer) Immediately after the SiOx layer deposition and with the film still in contact with the drum, a second acrylate was coated and cross linked on the same 100 meter web length in a manner similar to Layer 4 in Preparative Example 1.

(Layer 5—inorganic layer) In a separate pass through the roll-to-roll vacuum processing chamber and with the web at 3.7 meters/minute, a second SiAlOx was sputter deposited atop the same 100 meter web length using the same conditions as above. This provided a 30 nm thick SiAlOx layer deposited atop the second acrylate layer.

The resulting stack exhibited an average spectral transmission Tvis=90.0% (determined by averaging the percent transmission T between 400 nm and 1400 nm) measured at a 0° angle of incidence. A water vapor transmission rate was measured in accordance with ASTM F-1249 at 50° C. and 100% RH using a WVTR tester obtained from MOCON, Inc., Minneapolis, Minn., under the trade designation "MOCON PERMATRAN-W" Model 700. The result was below the 0.005 g/m$^2$/day detection limit of the system. The laminate was then placed in an environmental chamber at 85° C. and 85% RH for a period of 1000 hours. The average transmission after aging was determined to be 89.6% and the WVRT was determined to be 0.013 g/m$^2$/day. The results are summarized in Table 1.

Preparative Example 3—PET (0.13 mm)/Barrier Layer with Silane

A UV-stabilized polyethylene terephthalate (UV-PET described above) support film was first treated in a single pass with a nitrogen plasma on the adhesion-primed surface, or back-side, of the incoming web. The UV-PET film was then re-oriented in the deposition chamber to deposit in subsequent passes onto the non-primed surface, or front-side, of the incoming web. The front-side surface of UV-PET was treated with a nitrogen plasma and then covered respectively with barrier layers of acrylate, SiAlOx, a second acrylte containing a silane coupling agent, and a second SiAlOx layer. The individual plasmas and layers were formed as follows:

(Plasma 1—plasma treatment on primed surface of UV-PET) A 450 m long roll of 0.127 mm thick×356 mm wide UV-PET film was loaded into a roll-to-roll vacuum processing chamber and nitrogen plasma treated as described in the Plasma 1 description of Preparative Example 2.

(Layer 1—smoothing polymeric layer) The vacuum processing chamber was then vented to atmosphere and the 350 m length of plasma-treated UV-PET film was reoriented such that the non-primed side of the UV-PET was facing "up" and the adhesion-primed with plasma-treatment side of the UV-PET was in contact with the coating drum. The chamber was again pumped down to a pressure of 2×10⁻⁵ Torr. The web speed was maintained at 3.7 meters/minute while maintaining the backside of the film in contact with a coating drum chilled to −10° C. With the backside of the UV-PET film in contact with the drum, a 350 m length of the non-primed film surface was treated with a nitrogen plasma and coated with tricyclodecane dimethanol di-acrylate in a similar manner to Layer 1 in Preparative Example 1.

(Layer 2—inorganic layer) Immediately after the acrylate deposition and with the film still in contact with the drum, a SiAlOx layer was sputter-deposited atop a 100 meter length of the plasma treated and acrylate-coated UV-PET film surface in a manner similar to Layer 2 in Preparative Example 1.

(Layer 3—protective polymeric layer) Immediately after the SiAlOx layer deposition and with the film still in contact with the drum, a second acrylate was coated and cross linked on the same 100 meter web length in a manner similar to Layer 4 in Preparative Example 1 but with the following exceptions; a coupling agent, N-n-BUTYL-AZA-2,2-DI-METHOXYSILACYCLOPENTANE (commercially available as "CYCLIC AZA SILANE 1932.4" from Gelest, Morrisville, Pa.), was added to the degassed SR-833S at 3% by mass prior to being pumped through the atomizer. The resulting monomer mixture formed a vapor stream that condensed onto the film surface and was polymerized after electron beam exposure using a multi-filament electron gun operated at 9.0 kV and 0.45 mA to form a 725 nm acrylate layer.

(Layer 4—inorganic layer) In a separate pass through the roll-to-roll vacuum processing chamber and with the web at 3.7 meters/minute, a second SiAlOx was sputter deposited atop the same 100 meter web length using the same conditions as Layer 5 in Preparative Example 1. This provided a 30 nm thick SiAlOx layer deposited atop the second acrylate layer.

The resulting stack exhibited an average spectral transmission Tvis=90.1% (determined by averaging the percent transmission T between 400 nm and 1400 nm) measured at a 0° angle of incidence. A water vapor transmission rate was measured in accordance with ASTM F-1249 at 50° C. and 100% RH using a WVTR tester obtained from MOCON, Inc., Minneapolis, Minn., under the trade designation "MOCON PERMATRAN-W" Model 700. The result was below the 0.005 g/m²/day detection limit of the system. The laminate was then placed in an environmental chamber at 85° C. and 85% RH for a period of 1000 hours. The average transmission after aging was determined to be 89.7% and the WVRT was determined to be 0.186 g/m²/day. The results are summarized in Table 1.

Example 1—ETFE (0.13 mm)/"8172P"/Barrier Layer/PET (0.13 mm)

Examples of laminated barrier assemblies were made on a roll-to-roll, rubber to steel roller laminator, similar to the GBC Pro-Tech Orca II (available from GBC Pro-Tech, De Forest, Wis.). The laminated construction was formed as follows.

The barrier film from Preparative Example 2 was loaded into a roll-to-roll laminator with the coated stack facing "up" and the non-coated stack side facing the idler faces. A 300 meter roll of two-sided release liner 50 micron acrylic pressure sensitive adhesive ("3M OPTICALLY CLEAR ADHESIVE 8172P") was loaded into the same laminator with the "up" side liner peeled off and rewound onto an auxiliary rewinder. The two films were brought into contact through a rubber to steel nip roller system. Tension of each of the films was controlled using a spring brake such that the resulting laminate was flat. The air cylinder actuator controlling the lamination pressure was set at 2.6×10⁵ Pa (38 psi). The web speed was maintained at 4.6 m/min (15 feet/min) throughout lamination of the two films. The rubber roller and steel rollers were both kept at room temperature. The resulting laminated construction consisting of film from Preparative Example 2, adhesive, and release liner was rewound with the acrylic pressure sensitive adhesive on the "outside" of the wound roll.

The output laminated construction roll was removed and loaded into the laminator with the release liner facing "up" and the non-coated side of film from Preparative Example 2 facing the idlers. The remaining release liner was peeled off to expose the adhesive and rewound onto an auxiliary rewinder. A 300 meter long roll of 125 micron, two side C-treated ETFE was loaded into the same laminator. The two films were brought into contact through a rubber to steel nip roller system. Tension of each of the films was controlled using a spring brake such that the resulting laminate was flat. The air cylinder actuator controlling the lamination pressure was set at 2.6×10⁵ Pa (38 psi). The web speed was maintained at 4.6 m/min (15 feet/min) throughout lamination of the two films. The rubber roller and steel rollers were both kept at room temperature. The resulting laminated construction consisted of Preparative Example 2, 8172P adhesive, and two-side C-treated ETFE.

The resulting stack exhibited an average spectral transmission Tvis=90.0% (determined by averaging the percent transmission T between 400 nm and 1400 nm) measured at a 0° angle of incidence. A water vapor transmission rate was measured in accordance with ASTM F-1249 at 50° C. and 100% RH using a WVTR tester obtained from MOCON, Inc., Minneapolis, Minn., under the trade designation "MOCON PERMATRAN-W" Model 700. The result was below the 0.005 g/m²/day detection limit of the system. The laminate was then placed in an environmental chamber at 85° C. and 85% RH for a period of 1000 hours. The average transmission after aging was determined to be 89.6% and the WVRT was determined to be 0.007 g/m²/day. The results are summarized in Table 1.

Example 2 ETFE (0.13 mm)/"8172P"/Barrier Layer with Silane/PET (0.13 mm)

A laminated barrier assembly was made as in Example 1 except that the barrier film of Preparative Example 3 was used in place of the barrier film of Preparative Example 2. The resulting laminated construction consisted of Preparative Example 3, 8172P adhesive, and two-side C-treated ETFE.

The resulting stack exhibited an average spectral transmission Tvis=90.0% (determined by averaging the percent transmission T between 400 nm and 1400 nm) measured at a 0° angle of incidence. A water vapor transmission rate was measured in accordance with ASTM F-1249 at 50° C. and 100% RH using a WVTR tester obtained from MOCON, Inc., Minneapolis, Minn., under the trade designation "MOCON PERMATRAN-W" Model 700. The result was below the 0.005 g/m²/day detection limit of the system. The laminate was then placed in an environmental chamber at 85° C. and 85% RH for a period of 1000 hours. The average transmission after aging was determined to be 89.6% and the WVRT was below the 0.005 g/m²/day detection limit of the system. The results are summarized in Table 1.

TABLE 1

|  | % T | 1000 hr 85/85 % T | Initial WVTR (g/m²/day) | 1000 hr 85/85 WVTR (g/m²/day) |
| --- | --- | --- | --- | --- |
| Preparative Example 1 | 91.1 | 91.0 | 0.007 | 0.018 |
| Preparative Example 2 | 90.0 | 89.6 | BDL | 0.013 |
| Preparative Example 3 | 90.1 | 89.7 | BDL | 0.186 |
| Example 1 | 90.0 | 89.6 | BDL | 0.007 |
| Example 2 | 90.0 | 89.6 | BDL | BDL |

BDL = Below Detectable Limit

Comparative Example 1

Stainless-Steel (25 micron)/encapsulant "ADCO PVA" (0.46 mm)/ETFE (0.13 mm) laminate A 1.3 cm (0.5 inch)×10 cm (4 inch) laminate comprising the following three layers was stacked in the following order:

(Layer 1) A 1.3 cm (0.5 inch)×10 cm (4 inch), 25 micron (0.001 inch) thick strip of Stainless-Steel (commercially available under the trade name "Starrett 666-1" feeler gage) was placed on top of a 30.5 cm (12 inch)×46 cm (18 inch)×0.51 cm (0.2 inch) glass panel.

(Layer 2) A 1.3 cm (0.5 inch)×10 cm (4 inch), 0.46 mm (0.018 inch) thick layer of encapsulant "ADCO PVA" was placed directly on top of Layer 1.

(Layer 3) A 1.3 cm (0.5 inch)×10 cm (4 inch), 0.13 mm (0.005 inch) thick Ethylene-TetraFluoroEthylene (ETFE) was placed directly on top of layer 2.

A 30.5 cm (12 inch)×46 cm (18 inch)×0.51 cm (0.2 inch) glass panel was then placed on top of the above described three layer stack. The glass panel weighed 1.5 kg (3.4 lbs). The three stack layer between glass panels was then put in a 150° C. oven for 10 minutes. In the oven, the encapsulant "ADCO PVA" melted and upon cooling solidified and bonded the ETFE layer and the Stainless Steel layer. After the 10 minutes duration the specimen was taken out of the oven and cooled down to room temperature. Then the excess encapsulant "ADCO PVA" that flowed past the edges of the ETFE and Stainless-Steel layers was trimmed with a pair of scissors. Then the curl of the trimmed sample was measured as described in "Curl Test Method" as an indication of the amount of residual stress remaining after the high temperature lamination process. For the Comparative Example 1 laminate, the specimen was noted to have a curvature of 9 m⁻¹. Curl results are shown in Table 2.

Example 3—PET with Barrier (0.13 mm)/PSA (51 Micron)/ETFE (0.13 mm) Laminate

A 1.3 cm (0.5 inch)×10 cm (4 inch), 0.13 mm (0.005 inch) thick UV-stabilized PolyEthylene Terephthalate (UV-PET) with barrier layer as described in Preparative Example 3 was hand laminated to a 1.3 cm (0.5 inch)×10 cm (4 inch), 0.13 mm (0.005 inch) thick Ethylene-TetraFluoroEthylene (ETFE) layer using a 51 micron (0.002 inch) thick PSA-A layer. This lamination was done by first laying the PET layer on a table with the barrier coated side facing up. Then one liner from one side of the PSA was removed and the PSA placed on top of the PET layer with freshly exposed PSA side in contact with the barrier coated PET side. The second liner remaining on the PSA was then peeled from the PSA and a sheet of 0.13 mm (0.005 inch) thick ETFE film was laid onto the second side of the PSA. A rubber hand roller was rolled back and forth on the PET/PSA/ETFE laminate to promote adhesion of the stack.

In order to test the PET/PSA/ETFE laminate, a 1.3 cm (0.5 inch)×10 cm (4 inch) strip of the laminate was prepared by using 1.3 cm (0.5 inch) wide parallel blade cutting knife. A 1.3 cm (0.5 inch)×10 cm (4 inch), 25 micron (0.001 inch) thick strip of stainless-steel feeler gage was placed on a 30.5 cm (12 inch)×46 cm (18 inch)×0.51 cm (0.2 inch) glass panel. A 1.3 cm (0.5 inch)×10 cm (4 inch), 0.46 mm (0.018 inch) thick layer of encapsulant "ADCO PVA" was placed directly on top of the stainless steel strip. The 1.3 cm (0.5 inch)×10 cm (4 inch) laminate was then placed on top of the encapsulant "ADCO PVA" layer with the PET side of the laminate in contact with the encapsulant "ADCO PVA" layer. Finally a 30.5 cm (12 inch)×46 cm (18 inch)×0.51 cm (0.2 inch) glass panel was placed on top of the above described five layer laminate. The top glass panel weighed 1.5 kg (3.4 lbs). The five layer laminate between glass panels was then placed into 150° C. oven for 10 minutes. In the oven, the encapsulant "ADCO PVA" melted and upon cooling solidified bonding of the top three layer laminate and the Stainless Steel layer. After the 10 minutes duration the specimen was taken from the oven and cooled down to room temperature. The excess encapsulant "ADCO PVA" that had flowed past the edges of the top three layer laminate and stainless-steel layers was trimmed with a pair of scissors. The curl of the trimmed sample was measured as described in "Curl Test Method" as an indication of the amount of residual stress caused by the high temperature lamination process. The specimen was noted to have a curvature of 3 m⁻¹. Curl results are shown in Table 2.

Example 4—PET with Barrier (0.13 mm)/PSA (51 Micron)/ETFE (51 Micron) Laminate

A laminate was prepared as in Example 3, but with a 51 micron thick ETFE layer. Strips of the laminate attached to a stainless-steel backing were prepared as in Example 3 and the curl was measured as described in "Curl Test Method" as an indication of the amount of residual stress caused by the high temperature lamination process. The specimen was noted to have a curvature of 2.5 m⁻¹. Curl results are shown in Table 2.

Example 5—PET with Barrier (51 Micron)/PSA (51 Micron)/ETFE (0.13 mm) Laminate

A laminate was prepared as in Example 3, but with a 51 micron PET barrier layer as described in Preparative Example 3. Strips of the laminate attached to a stainless-steel backing were prepared as in Example 1 and the curl was measured as described in "Curl Test Method" as an indication of the amount of residual stress caused by the high temperature lamination process. The specimen was noted to have a curvature of 6.5 m⁻¹. Curl results are shown in Table 2.

TABLE 2

| | Stainless steel (micron) | ADCO PVA (micron) | PET (micron) | PSA (micron) | Barrier | ETFE (micron) | Curl (m$^{-1}$) |
|---|---|---|---|---|---|---|---|
| Comparative Example 1 | 25 | 460 | NONE | NONE | NO | 130 | 9.0 |
| Example 3 | 25 | 460 | 130 | 51 | YES | 130 | 3.0 |
| Example 4 | 25 | 460 | 130 | 51 | YES | 51 | 2.5 |
| Example 5 | 25 | 460 | 51 | 51 | YES | 130 | 6.5 |

Example 6—ETFE (51 Micron)/"8172P"/Barrier Layer with Silane/PET (0.13 mm)

A laminated barrier assembly made as in Example 2 except that the ETFE layer was 51 microns thick. The resulting stack exhibited an average spectral transmission Tvis=90.8% (determined by averaging the percent transmission T between 400 nm and 1400 nm) measured at a 0° angle of incidence. Transmission data is shown in Table 3.

Example 7—"SCOTCHCAL 3640 GPS"/Barrier Layer with Silane/PET (0.13 mm)

A 152 mm×152 mm laminate was assembled at room temperature ambient conditions as follows: A 152 mm×152 mm piece of film "SCOTCHCAL 3640 GPS" was laminated using hand pressure and a felt squeegee by first removing the protective paper release liner and then placing the adhesive in contact to the barrier side of Preparative Example 3. Hand pressure and a felt squeegee were used to laminate the layers. The resulting stack exhibited an average spectral transmission Tvis=89.1% (determined by averaging the percent transmission T between 400 nm and 1400 nm) measured at a 0° angle of incidence. Transmission data is shown in Table 3.

Example 8—PVDF (0.05 mm)/"8172P"/Barrier Layer with Silane/PET (0.13 mm)

A 152 mm×152 mm laminate was assembled at room temperature ambient conditions as follows: A 152 mm×152 mm piece of "8172P" adhesive containing two protective release liners was laminated using hand pressure and a felt squeegee by first removing one of the clear protective release liner and then placing the adhesive in contact to the barrier side of Preparative Example 3. Hand pressure and a felt squeegee were used to laminate the layers. The second clear protective release liner was then removed from the "8172P" adhesive such that now the PVDF film was placed in contact with the "8172P" adhesive and laminated to the assembly using hand pressure and felt squeegee. The resulting stack exhibited an average spectral transmission Tvis=91.6% (determined by averaging the percent transmission T between 400 nm and 1400 nm) measured at a 0° angle of incidence. Transmission data is shown in Table 3.

Example 9—PVDF (0.05 mm)/PSA-A/Barrier Layer with Silane/PET (0.13 mm)

A laminated barrier assembly was made as in Example 8 except that the "8172P" adhesive was replaced with PSA-A adhesive. The resulting stack exhibited an average spectral transmission Tvis=91.0% (determined by averaging the percent transmission T between 400 nm and 1400 nm) measured at a 0° angle of incidence. Transmission data is shown in Table 3.

TABLE 3

| Example | % T |
|---|---|
| 6 | 90.8 |
| 7 | 89.1 |
| 8 | 91.6 |
| 9 | 91.0 |

Example 10—T-Peel Tests for Various Laminates

Various laminate samples were constructed for T-Peel testing. Sample A was made as follows: A 178 mm wide×178 mm long laminate (having a 25 mm unbonded end for clamping in the grips of the test machine) for T-Peel testing was made comprising the following layers that were stacked in the following order:

(Layer 1) A 178 mm×178 mm solar backsheet film (Madico TAPE) was orientated with the 100 micron ethylene vinylacetate (EVA) layer facing up.

(Layer 2) A 178 mm wide×152 mm long sample of Etimex 496.10 was placed on top of Layer 1 after removing the release liner.

(Layer 3) A 178 mm×178 mm sample of Preparative Example 1 Barrier Film with the barrier surface facing the Etimex 496.10 layer was placed such that it is directly aligned on top of Layer 1 and completely covering Layer 2. These layers were then placed into a Spire 350 Vacuum Laminator (commercially available from Spire Corporation Bedford, Mass.). The laminate was then cured for 12 minutes at 150° C. under 1 atm (1×10$^5$ Pa) of pressure. The resulting laminate was then cut into 25 mm wide×152 mm long strips such that one end contains the 25 mm unbonded films that are to be placed in the clamping grips of the test machine. The two unbonded ends of film were placed in a tension testing machine and T-Peel testing was then completed as described in "T-Peel Test Method." The average peak peel force was determined to be 3.2 N/cm (1.8 lbf/in).

Sample B was constructed as described for Sample A except that the barrier layer of Preparative Example 2 was used in place of the barrier layer of Preparative Example 1. T-Peel testing was then completed as described in "T-Peel Test Method." The average peak peel force was determined to be 5.3 N/cm (3.0 lbf/in).

Sample C was constructed as described for Sample A except that the barrier layer of Preparative Example 3 was used in place of the barrier layer of Preparative Example 1. T-Peel testing was then completed as described in "T-Peel Test Method." The average peak peel force was determined to be 21.2 N/cm (12.1 lbf/in). The results are summarized in Table 4.

Sample D was constructed as described for Sample A except that the barrier layer of Example 1 was used in place of the barrier layer of Preparative Example 1. T-Peel testing was then completed as described in "T-Peel Test Method." The average peak peel force was determined to be 75.3 N/cm (43.0 lbf/in).

Sample E was constructed as described for Sample A except that the barrier layer of Example 2 was used in place of the barrier layer of Preparative Example 1. T-Peel testing was then completed as described in "T-Peel Test Method." The average peak peel force was determined to be 66.4 N/cm (37.9 lbf/in).

The results of the peel tests are summarized in Table 4.

TABLE 4

| Sample | Peel Force (N/cm) |
|---|---|
| A | 3.2 |
| B | 5.3 |
| C | 21.1 |
| D | 75.3 |
| E | 66.4 |

Example 11—T-Peel and Curl Tests for Various Laminates

Various laminate samples were constructed for T-Peel testing and curl testing. Sample G was constructed as Sample A of Example 10 except that "JURASOL® TL", was used in place of Etimex 496.10. Samples H-L were prepared by similarly laminating the barrier film of Examples 1, 2, 7, 8, and 9, respectively, to Madico TAPE using "JURASOL® TL".

T-Peel testing was completed as described in "T-Peel Test Method" and Curl measurements were completed on 13 mm wide×100 mm long strips as described in "Curl Test Method." The results are summarized in Table 5.

TABLE 5

| Sample | Peel Force (N/cm) | Curl (m$^{-1}$) |
|---|---|---|
| G | 0.4 | 7.9 |
| H | 17.7 | 1.6 |
| I | 18.6 | 1.6 |
| J | 29.9 | 1.6 |
| K | 16.3 | 1.6 |
| L | 36.8 | 1.6 |

Example 12—Barrier, Curl and Delamination Properties

Sample M was made as follows: A layer of encapsulant "ADCO PVA" was applied to a 15 cm×15 cm (6 inch×6 inch) glass substrate. A first 0.035 mm thick strip of tinned copper foil 128 mm long by about 12 mm wide was placed on top of the encapsulant "ADCO PVA" with the length direction of the strip along the diagonal of the glass substrate. A second stainless steel strip, which had similar dimensions to the first strip was applied to the encapsulant "ADCO PVA" layer above the first strip and oriented along the opposite diagonal direction. A second encapsulant "ADCO PVA" layer was then applied over the stainless steel strips and a 0.13 mm thick PET layer was applied over the second encapsulant layer. The laminate was then cured for 12 minutes at 150° C. under 1 atm (1×10$^5$ Pa) of pressure. The sample was then subjected to 12 humidity freeze cycles according to IEC 61215 Humidity freeze Test (10.12) and no delaminations were observed. The curl was measured according to "Curl Test Method" and found to be 0.4 m$^{-1}$.

A second laminate was made by applying a layer of encapsulant "ADCO PVA" to a 15 cm×15 cm (6 inch×6 inch) glass substrate and then applying a 114 mm×114 mm humidity indicator card (obtained from Sud-Chemie Performance Packaging Colton, Calif., under the trade designation "HUMITECTOR Maximum Humidity Indicator P/N MXC-56789") on top of the encapsulant "ADCO PVA". A second encapsulant "ADCO PVA" layer was placed over the humidity indicator card and and a 0.13 mm thick PET layer was applied over the second encapsulant layer. The laminate was then cured for 12 minutes at 150° C. under 1 atm (1×10$^5$ Pa) of pressure. The resulting laminate was placed in an environmental chamber at 85° C. and 85% RH for a period of 100 hours. Upon 100 hours of 85° C. and 85% RH exposure the humidity indicator card was visually examined and the 80% indicator had dissolved crystals. This indicates that the humidity indicator sensor was exposed to at least 80% RH for 24 hours.

Sample N was made as follows: Laminates with tinned copper foil strips and with a humidity sensor strip were constructed as described for Sample M except that the PET layer was replaced with a 0.13 mm thick ETFE layer. The laminate with the tinned copper foil strips was subjected to 12 humidity freeze cycles and no delamination was observed. The curl was measured according to "Curl Test Method" and found to be 0.4 m$^{-1}$. A humidity test was done as described for Sample M and this indicated that the humidity indicator sensor was exposed to at least 80% RH for 24 hours.

Sample O was made as follows: Laminates with tinned copper foil strips and with a humidity sensor strip were constructed as described for Sample M except that the PET layer was replaced with the barrier film of Preparative Example 1 with the barrier side of the barrier film facing the encapsulant "ADCO PVA" layers. The laminate with the tinned copper foil strips was subjected to 12 humidity freeze cycles and delaminations were observed around all edges. The curl was measured according to "Curl Test Method" and found to be 0.4 m$^{-1}$. A humidity test was done as described for Sample M and this indicated that the humidity indicator sensor was exposed to at least 50% RH for 24 hours.

Sample P was made as follows: Laminates with tinned copper foil strips and with a humidity sensor strip were constructed as described for Sample M except that the PET layer was replaced with the barrier film of Example 6 with the barrier side of the barrier film facing the encapsulant "ADCO PVA" layers. The laminate with the tinned copper foil strips was subjected to 12 humidity freeze cycles and no delamination was observed. The curl was measured according to "Curl Test Method" and found to be 0.4 m$^{-1}$. A humidity test was done as described for Sample M and this indicated that the humidity indicator sensor was exposed to at least 50% RH for 24 hours.

Sample Q was made as follows: Laminates with tinned copper foil strips and with a humidity sensor strip were constructed as described for Sample M except that the glass layer was replaced with a 15 cm×15 cm×25 micron (6 inch×6 inch×0.001 inch) stainless steel feeler gage material. The laminate with the tinned copper foil strips was subjected to 12 humidity freeze cycles and no delamination was observed. The curl was measured according to "Curl Test Method" and found to be 0.4 m$^{-1}$. A humidity test was done as described for Sample M and this indicated that the humidity indicator sensor was exposed to at least 80% RH for 24 hours.

Sample R was made as follows: Laminates with tinned copper foil strips and with a humidity sensor strip were constructed as described for Sample Q except that the PET layer was replaced with a 0.13 mm ETFE layer. The laminate with the tinned copper foil strips was subjected to 12 humidity freeze cycles and no delamination was observed. The curl was measured according to "Curl Test Method" and found to be 2.0 m$^{-1}$. A humidity test was done as described for Sample M and this indicated that the humidity indicator sensor was exposed to at least 80% RH for 24 hours.

Sample S was made as follows: Laminates with tinned copper foil strips and with a humidity sensor strip were constructed as described for Sample Q except that the PET layer was replaced with the barrier film of Preparative Example 1 with the barrier side of the barrier film facing the encapsulant "ADCO PVA" layers. The laminate with the tinned copper foil strips was subjected to 12 humidity freeze cycles and delamination was observed around the tinned copper foil strips. The curl was measured according to "Curl Test Method" and found to be 2.0 m$^{-1}$. A humidity test was done as described for Sample M and this indicated that the humidity indicator sensor was exposed to at least 50% RH for 24 hours.

Sample T was made as follows: Laminates with tinned copper foil strips and with a humidity sensor strip were constructed as described for Sample Q except that the PET layer was replaced with the barrier film of Example 6 with the barrier side of the barrier film facing the encapsulant "ADCO PVA" layers. The laminate with the tinned copper foil strips was subjected to 12 humidity freeze cycles and no delamination was observed. The curl was measured according to "Curl Test Method" and found to be 0.4 m$^{-1}$. A humidity test was done as described for Sample M and this indicated that the humidity indicator sensor was exposed to at least 50% RH for 24 hours.

The data for Samples M-T is summarized in Table 6.

TABLE 6

| Sample | 100 Hr 85/85 Humidity Indicator | Curl (m$^{-1}$) | 12 Humidity Freeze Cycles (delamination Yes/No) |
|---|---|---|---|
| M | 80% | 0.4 | No |
| N | 80% | 0.4 | No |
| O | 50% | 0.4 | Yes |
| P | 50% | 0.4 | No |
| Q | 80% | 0.4 | No |
| R | 80% | 2.0 | No |
| S | 50% | 2.0 | Yes |
| T | 50% | 0.4 | No |

Prophetic Example

Instead of the ETFE film described above, a UV reflective multilayer optical film can be used as the substrate. Nitrogen plasma surface treatment can be used as described above. The adhesion and barrier properties described above would be expected to be similar when a UV reflective multilayer optical film is used. A multilayer optical film can be made with first optical layers of polyethylene terephthalate (PET) (obtained from Eastman Chemical, Kingsport, Tenn., under the trade designation "EASTAPAK 7452") and second optical layers of a copolymer of 75 weight percent methyl methacrylate and 25 weight percent ethyl acrylate (coPMMA) (obtained from Ineos Acrylics, Inc., Memphis, Tenn., under the trade designation "PERSPEX CP63"). The PET and coPMMA can be coextruded through a multilayer polymer melt manifold to form a stack of 224 optical layers. The layer thickness profile (layer thickness values) of this UV reflector can be adjusted to be approximately a linear profile with the first (thinnest) optical layers adjusted to have about a ¼ wave optical thickness (index times physical thickness) for 300 nm light and progressing to the thickest layers which can be adjusted to be about ¼ wave thick optical thickness for 400 nm light. Layer thickness profiles of such films can be adjusted to provide for improved spectral characteristics using the axial rod apparatus disclosed in U.S. Pat. No. 6,783,349 (Neavin et al.), the disclosure of which is incorporated herein by reference, combined with layer profile information obtainable with atomic force microscopic techniques. 20 wt % of UV absorber masterbatch (e.g., "Sukano TA07-07 MB") can be extrusion compounded into both the first optical layers (PET) and second optical layers (coPMMA).

In addition to these optical layers, non-optical protective skin layers of PET (260 micrometers thickness each) can be coextruded on either side of the optical stack. 20 wt % of UV absorber masterbatch (e.g., "Sukano TA07-07 MB") can be compounded into these PET protective skin layers. This multilayer coextruded melt stream can be cast onto a chilled roll at 5.4 meters per minute creating a multilayer cast web approximately 500 micrometers (20 mils) thick. The multilayer cast web can then be preheated for about 10 seconds at 95° C. and biaxially oriented at a draw ratios of 3.5×3.7. The oriented multilayer film can be further heated at 225° C. for 10 seconds to increase crystallinity of the PET layers.

All patents and publications referred to herein are hereby incorporated by reference in their entirety. Various modifications and alterations of this disclosure may be made by those skilled in the art without departing from the scope and spirit of this disclosure, and it should be understood that this disclosure is not to be unduly limited to the illustrative embodiments set forth herein.

What is claimed is:

1. An assembly comprising, in order:
   a first polymeric film substrate;
   a barrier film comprising at least first and second polymer layers separated by an inorganic barrier layer that is immediately adjacent to both the first and second polymer layers, the first and second polymer layers each comprising a polymeric reaction product of at least one of acrylic or methacrylic monomers;
   an acrylic pressure sensitive adhesive layer; and
   a second polymeric film substrate comprising a fluoropolymer and in direct contact with the acrylic pressure sensitive adhesive layer.

2. The assembly of claim 1, wherein the acrylic pressure sensitive adhesive comprises an ultraviolet absorber (UVA).

3. The assembly of claim 1, wherein the first polymeric layer is non-heat stabilized.

4. The assembly of claim 1, wherein the barrier film has a water vapor transmission rate less than 0.005 g/m$^2$/day at 50° C. and 100% relative humidity.

5. The assembly of claim 4, wherein the barrier film has an oxygen transmission rate less than 0.005 g/m$^2$/day at 23° C. and 90% relative humidity.

6. The assembly of claim 1, wherein the assembly is transmissive to visible and infrared light, and wherein the second polymeric film substrate is resistant to degradation by ultraviolet light.

7. The assembly of claim 1, wherein a ratio of the thickness of the first polymeric film to the second polymeric film is at least 5:2.

8. The assembly of claim 1, wherein the acrylic pressure sensitive adhesive layer has a tensile modulus of up to $3.4 \times 10^8$ Pascals.

9. The assembly of claim 1 having a curl of up to 7 m$^{-1}$.

10. The assembly of claim 1, wherein the inorganic barrier layer is an oxide layer that shares a siloxane bond with at least one of the first or second polymer layers.

11. The assembly of claim 1, wherein the first polymeric film substrate comprises at least one of polyethylene terephthalate, polyethylene naphthalate, polyetheretherketone, polyaryletherketone, polyarylate, polyetherimide, polyarylsulfone, polyethersulfone, polyamideimide, or polyimide.

12. The assembly of claim 1, wherein a ratio of a tensile modulus of the first polymeric film substrate to a tensile modulus of the second polymeric film substrate is at least 2 to 1.

13. The assembly of claim 1, wherein at least one of the first or second polymer layers comprises a silane and a polymer comprising an acrylate monomer.

14. The assembly of claim 13, wherein the silane is an amino silane represented by formula $Z_2N\text{-}L\text{-}SiY_xY'_{3-x}$, wherein each Z is independently hydrogen or alkyl having up to 12 carbon atoms, L is alkylene having up to 12 carbon atoms, Y is alkoxy having up to 12 carbon atoms or halogen, Y' is alkyl having up to 12 carbon atoms, and x is at least 1.

15. The assembly of claim 1, wherein the first and second polymeric film substrates have first and second coefficients of thermal expansion respectively, wherein the second coefficient is at least 40 parts per million per Kelvin higher than the first coefficient.

16. The assembly of claim 1, wherein the assembly has an average transmission over the range of 400 nm to 1400 nm of at least 75%.

17. The assembly of claim 1, wherein the first and second polymer layers each further comprise polymerized volatilizable acrylic or methacrylic monomers.

* * * * *

UNITED STATES PATENT AND TRADEMARK OFFICE
CERTIFICATE OF CORRECTION

| | | |
|---|---|---|
| PATENT NO. | : 10,693,024 B2 | Page 1 of 1 |
| APPLICATION NO. | : 16/017128 | |
| DATED | : June 23, 2020 | |
| INVENTOR(S) | : Mark D. Weigel et al. | |

It is certified that error appears in the above-identified patent and that said Letters Patent is hereby corrected as shown below:

In the Specification

<u>Column 1,</u>
Line 2, before "BACKGROUND" please insert the following: -- This invention was made with government support under DE-EE0004739 awarded by the U.S. Department of Energy. The government has certain rights in the invention. --

Signed and Sealed this
Eleventh Day of March, 2025

Coke Morgan Stewart
*Acting Director of the United States Patent and Trademark Office*